United States Patent
Miyakawa et al.

[11] Patent Number: 5,912,544
[45] Date of Patent: Jun. 15, 1999

[54] ELECTRONIC EQUIPMENT AND METHOD FOR ENABLING PLURAL TYPES OF BATTERIES TO BE SELECTIVELY USED

[75] Inventors: Akihisa Miyakawa, Koganei; Nobuaki Seki, Kodaira; Satoshi Fukuchi; Yoshiyuki Sueno, both of Tachikawa, all of Japan

[73] Assignee: Hitachi Denshi Kabushiki Kaisha, Tokyo, Japan

[21] Appl. No.: 08/906,800

[22] Filed: Aug. 6, 1997

Related U.S. Application Data

[63] Continuation-in-part of application No. 08/665,355, Jun. 17, 1996, abandoned.

[30] Foreign Application Priority Data

| Jun. 22, 1995 | [JP] | Japan | 7-155654 |
| Nov. 6, 1996 | [JP] | Japan | 8-293919 |
| Dec. 19, 1996 | [JP] | Japan | 8-340135 |

[51] Int. Cl.$^6$ ............................................. H02J 7/00
[52] U.S. Cl. ............................................. 320/106; 320/152
[58] Field of Search ................................. 320/106, 134, 320/136, 152, DIG. 21

[56] References Cited

U.S. PATENT DOCUMENTS

| 5,164,652 | 11/1992 | Johnson et al. | 320/106 |
| 5,656,917 | 8/1997 | Theobald | 320/106 |
| 5,684,387 | 11/1997 | Patino | 320/106 |
| 5,696,433 | 12/1997 | Patino | 320/106 |
| 5,703,467 | 12/1997 | Patino | 320/106 |

*Primary Examiner*—Peter S. Wong
*Assistant Examiner*—K. Shin
*Attorney, Agent, or Firm*—Antonelli, Terry, Stout & Kraus, LLP

[57] ABSTRACT

Electronic equipment, for enabling a plurality types of batteries to be selectively used, which is designed in such a way that discharge characteristic data of a plurality types of batteries to be used is previously stored in a memory unit, a battery including a resistor indicating the type of the battery is fitted to the electronic equipment, the type of the battery is identified on the basis of a resistance value of the resistor, the discharge characteristic data of the battery corresponding to the identified type of battery is read out from the memory unit, a battery voltage is compared with the discharge characteristic data thus read out and a remaining power of the battery is calculated to display the information relating to the remaining power thus calculated.

15 Claims, 14 Drawing Sheets

ELECTRONIC EQUIPMENT AND METHOD FOR ENABLING PLURAL TYPES OF BATTERIES TO BE SELECTIVELY USED

CROSS REFERENCES TO RELATED APPLICATIONS

This application is a continuation-in-part of U.S. application Ser. No. 08/665,355, filed Jun. 17, 1996, the disclosure of which is hereby incorporated by reference.

BACKGROUND OF THE INVENTION

The present invention relates in general to electronic equipment and a method for enabling at least two types of batteries to be selectively used, and more particularly to electronic equipment, such as a portable radio apparatus, which is capable of carrying out the indication of a remaining power of a battery, the warning about a low power of a battery, the control for limitation of the operation, and the like.

The description will hereinafter be given with respect to conventional electronic equipment, which carries out the indication of a remaining power of a battery as a power source, the warning about a low power of a battery, the control for limitation of the operation, and the like on the basis of comparison of an output voltage of the battery with the discharge characteristic data of the battery, which is previously specified, with reference to FIG. 3. FIG. 3 shows a typical example of a configuration of a conventional portable radio apparatus.

A radio apparatus 1 includes: a transmission/reception unit 2 for carrying out transmission/reception; resistors 3 and 4 for dividing a power source voltage; an A/D conversion unit 5 for subjecting the divided power source voltage to A/D conversion; a memory unit 7 for storing data relating to discharge characteristics or data relating to a voltage range for display of a remaining power of a battery 10 integrated into the radio apparatus 1; a microcomputer 6 for controlling the transmission/reception unit 2 and driving a display unit 8 for indicating a state of the power source voltage on the basis of both the discharge characteristic data which is stored in the memory unit 7 and the data relating to the power source voltage which is obtained by the A/D conversion in the A/D conversion unit 5; and a regulated power source unit 9 for stabilizing the voltage of the battery 10 which varies with time in order to supply those units with the electric power. The battery 10 is integrated into the radio apparatus 1 configured described above so as to supply those units with the electronic power.

Next, the description will hereinbelow be given with respect to the operation of carrying out the indication of a remaining power of the battery, the warning about a low power of the battery, the control for limitation of the operation on the basis of comparison of the output voltage of the battery integrated into the radio apparatus 1 with the discharge characteristic data of the battery which is previously specified.

In FIG. 3, the discharge characteristic data or the data relating to the voltage range for indication of a remaining power of one type of battery for use in the radio apparatus is previously stored in the memory unit 7. Now, the discharge characteristic data is, as shown in FIG. 4, meant data 20 expressed by the characteristic curve exhibiting the relationship between the discharge time and the battery voltage. In addition, the voltage range for indication of a remaining power is meant a voltage range ranging from a full charging voltage to a discharge end voltage.

The power source voltage of the battery 10 is divided by the resistors 3 and 4 and is subjected to the A/D conversion in the A/D conversion unit 5 to be supplied to the microcomputer 6.

The microcomputer 6 converts the voltage data outputted from the A/D conversion unit 5 into power source voltage data, compares the power source voltage data obtained by the conversion with the discharge characteristic data of the battery 10, shown in FIG. 4, which is stored in the memory unit 7, and detects which point on the discharge characteristic curve the power source voltage is located. Then, the microcomputer 6 calculates the remaining power of the battery on the basis of the detection result, and instructs the display unit 8 to indicate the data relating to the remaining power of the battery in the form of a percentage display or a bar chart. Then, the user can recognize the degree of consumption of the battery power by looking at that display.

As for the method of calculating the remaining power of the battery, heretofore, some methods have been well known. For example, there is well known a method wherein the discharge amount of battery is obtained by carrying out the integral calculation on the basis of both the data relating to the power source voltage, which varies with time, from the A/D conversion unit 5 and the discharge characteristic data shown in FIG. 4, and hence the remaining power of the battery can be calculated at the ratio of the discharge amount of the battery thus calculated to the total capacity of the battery.

As for the method of calculating the remaining power of the battery, there is well known another method wherein the discharge time ranging from the full charging voltage in which the remaining power of the battery is 100% to the discharge end voltage in which the remaining power of the battery is 0% is divided into five equal parts as shown in FIG. 5, the data relating to the discharge time periods of the resultant five equal parts is stored in the memory unit 7, the discharge time period when the radio apparatus 1 is actually used is timed, and the discharge time period thus timed is compared with the discharge time parts the data of which is stored in the memory unit 7, whereby the data relating to the remaining power of the battery can be displayed with the five equal parts. Incidentally, the number of division parts may be selected arbitrarily.

At the time when detecting that the output voltage of the battery 10 is decreased to a level equal to or lower than a predetermined value, the microcomputer 6 generates, in addition to the display of the remaining power of the battery, for example, an alarm sound or a warning indication for a low power of the battery in order to urge the user to charge the battery 10. In addition, at the time when detecting that the output voltage of the battery 10 is decreased to reach the discharge end voltage of the battery 10, the microcomputer 6 carries out the control in such a way as to turn off the power source of the transmission/reception unit 2, thereby preventing the battery 10 from being excessively discharged.

The alarm sound for the low power of the battery is generated at a time point when the output voltage of the battery 10 reaches a voltage value which is slightly larger than the discharge end voltage. As a result, the over discharge of the battery can be prevented and also the inconvenience for utilization can be prevented in which the output voltage of the battery 10 reaches the discharge end voltage and the power source of the electronic apparatus is unexpectedly turned off.

As for such a battery integrated into the electronic equipment configured as described above, the various batteries are present in correspondence to the continuous operating time, the weight, the price, the size, and the like of the electronic equipment having the associated battery integrated thereinto. In the conventional electronic equipment, however, it is impossible to identify the type and the capacity of the battery integrated thereinto, and hence only the specified one type of battery can be used.

More specifically, in the conventional electronic equipment, the discharge characteristic data and the data relating to the voltage range for display of the remaining power of the battery having the specified type and capacity are stored in the memory unit. Then, if the battery having the type and capacity different from those specified are used, then the following inconvenience will occur.

(1) The deviation occurs in the display of the remaining power of the battery, and hence the user can not confirm the degree of consumption of the power of the battery being used.

(2) In the case where the data of the reference voltage and the discharge end voltage which is stored in the memory unit 7 and is used in order to generate the alarm sound for the low power of the battery is highly deviated with respect to the characteristics of the battery integrated into the electronic equipment, the user is urged to charge the battery though the battery is sufficiently discharged. In particular, in the nickel series secondary battery and the like, the phenomenon in which when the insufficient charge/discharge is repeated, the power source voltage or the capacity is apparently reduced, i.e., the so-called memory effect is caused.

(3) In the case where the data of the reference voltage and the discharge end voltage which is stored in the memory unit 7 and is used in order to generate the alarm sound for the low power of the battery is lowly deviated with respect to the characteristics of the battery integrated into the electronic equipment, there is an evil that the over discharge of the battery is caused and hence the lifetime of the battery is shortened. In particular, in the lithium series secondary battery and the like, there is a risk of causing the explosion.

In addition, since the discharge characteristics of the battery varies depending on the temperature of the battery, in the specified battery as well, the change in the temperature of the battery due to the ambient temperature of the electronic equipment in use, the calorification of the electronic equipment, and the like results in the above-mentioned inconvenience in utilization being caused.

This will hereinbelow be concretely described with reference to FIG. 8. FIG. 8 shows the discharge temperature characteristics when a Ni-Cd series battery with 600 mAh rated capacity is discharged with a constant current as the discharge current of 600 mA. As apparent from FIG. 8, the voltage of the battery is soon dropped as the ambient temperature is lower with the discharge capacity at a room temperature (23° C.) as 100%. In this connection, if the voltage value of this battery for the warning about the low power of the battery is 10.8V and the battery is discharged with a constant current of 600 mA, though the battery is not sufficiently discharged at −20° C., a user urged to charge the battery. This results in that the operating time of the electronic equipment is extremely shortened and the memory effect is caused.

In addition, in the case where the current consumption of the electronic equipment having a battery as its power source is greatly changed, e.g., as in the portable radio apparatus, the current consumption is largely changed depending on the operation mode such as transmission, reception and a waiting mode, since a large current is caused to flow in transmission so that the voltage is developed across the internal resistance of the battery, the errors occur in the indication of the remaining power of the battery and the warning about the low power of the battery and hence the convenience of using the battery is very poor. This is a big problem.

This problem will hereinbelow be described more concretely with reference to FIG. 9. FIG. 9 shows the discharge temperature characteristics of a lithium ion series battery in the actual use state of the radio apparatus. As apparent from FIG. 9, if a large current of 1,300 mA for example is caused to flow in the transmission state, then the large voltage is developed across the internal resistance of the battery. In this connection, if the battery is discharged with 9.5V as the voltage value for warning about the low power of the battery, though the remaining power is still available in both the reception mode and the waiting mode and hence the battery can be used, since in the transmission mode, the warning about the low power of the battery is issued due to that voltage drop across the internal resistance of the battery, a user is urged a little early to charge the battery and hence the accurate judgement can not be obtained. Further, since the internal resistance of the battery increases and hence the voltage drop thereacross becomes large as the ambient temperature is lower, this results in the above-mentioned inconvenience being increased.

In addition, in the electronic equipment, such as a portable radio apparatus, which operates with such a battery, it is desirable that the malfunction of the load equipment and the destruction of the battery resulting from the reduction of the terminal voltage of the battery can be prevented and also the prolongation of the operating time which is provided by the battery can be obtained as much as possible.

Conventionally, in addition to the above-mentioned voltage threshold for the warning about the low power of the battery, the threshold for the discharge end detection voltage of the battery is previously set to a level lower than that threshold. Then, at the time when the terminal voltage of the battery is decreased down to the discharge end detection voltage, the remaining power of the battery is regarded as zero, and then the operation of the electronic equipment is stopped.

In the above-mentioned prior art, there arises a problem that it is not said that the accurate detection of the remaining power of the battery is suitably taken into consideration, and hence the dissatisfaction still remains with respect to the sufficient utilization of the battery capacity.

That is, while the terminal voltage of the battery is certain a factor representing the remaining power of the battery, the terminal voltage is also changed due to any other factor and hence does not necessarily correspond to the remaining power of the battery uniquely.

In the prior art, however, as described above, since the remaining power of the battery is simply judged on the basis of only the terminal voltage of the battery, this lacks in accuracy.

This problem will hereinbelow be described more concretely with reference to FIG. 10.

Firstly, FIG. 10 shows the voltage characteristics when a lithium ion secondary battery in which a terminal voltage $V_B$ in the charge state is 12.6V (4×3 cells) and the rated capacity recommendation value is about 800 mAh is used with the recommendation rated current (e,g., 150 mA). In this case, there is shown the characteristics that due to the change in the internal resistance resulting from mainly the discharge of the battery, as shown in the figure, the terminal voltage decreases with the progress of the discharge. Incidentally, it is well known that in the case of the lithium ion series secondary battery, the change in the internal resistance is particularly remarkable.

Now, in this case, if the discharge end detection voltage is set to 8.1V as shown in the figure, and firstly, the remaining power of the battery is detected under the rated current, then it is detected in a point ① that the remaining power of the battery is zero. In this case, the battery can be utilized up to approximately the rated capacity.

However, when the electronic equipment which is powered by this battery is a portable radio apparatus or the like in which the current is greatly changed during the use thereof, e.g., the power consumption in transmission is largely different from the power consumption in reception, the large current such as 1,300 mA is caused to flow in transmission. At this time, as shown in the figure, the large voltage drop is developed due to the internal resistance of the battery.

For this reason, at this time, as illustrated by a point ②, though only about 700 mAh is discharged yet, it will be judged at this point that the remaining power of the battery is zero, and hence the accurate judgement for the remaining power of the battery can not be obtained.

Further, in addition thereto, in the above-mentioned conventional electronic equipment, terminals used to detect the type of the battery and the various batteries having different capacities, i.e., terminals used to detect the type and capacity of the battery are required to be provided for both the electronic equipment side and the battery side. Mounting the terminals to both the electronic equipment and the battery results in that the additional physical volume is required therefor, and the structure becomes complicated in order to ensure the stability such as the connection of the terminals to reduce the producibility. In other words, such mounting is disadvantageous in terms of miniaturization, lightness and the cost of the electronic equipment. Further, in the equipment for which waterproof and the like are required, the realization of the equipment per se becomes difficult due to the complicatedness in its structure.

SUMMARY OF THE INVENTION

In view of the foregoing problems, the present invention was made in order to solve the above-mentioned problems associated with the prior art, and therefore a first object of the present invention is, in electronic equipment employing a battery as a power source, to provide electronic equipment and a method by which the indication of a remaining power of the battery, the warning about the low power of the battery, the control for limitation of the operation and the like can be carried out in correspondence to the type and the capacity of the battery integrated into the electronic equipment and the user can use selectively the batteries having a plurality of different types and capacity.

In addition, a second object of the present invention is, in a portable radio apparatus employing a battery as a power source, to provide electronic equipment and a method by which the user can use alternatively one of at least a nickel series secondary battery and a lithium series secondary battery, and also the indication of a remaining power of the battery, the warning about the low power of the battery, the control for limitation of the operation and the like can be carried out in correspondence to the type and the capacity of the battery integrated into the electronic equipment.

A third object of the present invention is, in electronic equipment employing a battery as a power source, to provide electronic equipment and a method by which the indication of the remaining power of a battery, the warning about the low power of the battery, the control for limitation of the operation of the electronic equipment, and the like can be carried out with very high accuracy in correspondence to the type and capacity of the battery which is integrated into the electronic equipment, the temperature of the battery, and the operation mode of the electronic equipment, and a user can selectively use a large number of different types and capacities of batteries, and which a user can use very conveniently.

A fourth object of the present invention is to provide an apparatus for detecting a remaining power of a battery which is designed in such a way that the judgement of the remaining power of a battery can be more accurately obtained and the practical use of the power of a battery can be obtained sufficiently without being accompanied with the malfunction due to the reduction of the power source voltage of electronic equipment which is operated with a battery.

A fifth object of the present invention is to provide an apparatus for enabling different types of batteries to be selectively used by which batteries having different types and capacities can be detected without providing both electronic equipment side and a battery side with terminals coming in mechanically contact therewith for detecting different types and capacities of batteries, and which is of small size and light, and which can be realized inexpensively.

In order to attain the above-mentioned first object, according to the present invention, there is provided electronic equipment, employ a battery as a power source, which includes detection means for detecting both a type and capacity of a battery integrated into the electronic equipment, and storage means for storing previously discharge characteristic data relating to batteries having a plurality of different types or capacity in the form of a data table, wherein the discharge characteristic data corresponding to the type and the capacity of the battery detected by the detection means is selectively fetched from the data table, and on the basis of the discharge characteristic data thus fetched, the indication of a remaining power of the battery, the warning about the low power of the battery, the control for limitation of the operation and the like are carried out.

In addition, in order to attain the above-mentioned second object, according to the present invention, there is provided a portable radio apparatus, employing a battery as a power source, which includes detection means for detecting a type and capacity of a battery integrated into the portable radio apparatus, and storage means for storing previously discharge characteristic data relating to at least a nickel series secondary battery and a lithium series secondary battery in the form of a data table, wherein the discharge characteristic data of the battery corresponding to the type and the capacity of the battery detected by the detection means is selectively fetched from the data table, and on the basis of the discharge characteristic data thus fetched, the indication of a remaining power of the battery, the warning about the low power of the battery, and the control for limitation of the operation are carried out.

As a result, according to the present invention, for the battery which is arbitrarily selected by the user, the indication of a remaining power of the battery, the warning about the low power of the battery, the control for limitation of the operation and the like can be carried out more accurately.

In order to attain the third object, electronic equipment employing a battery as a power source according to the present invention includes: detection means for detecting the type and capacity of a battery which is integrated into the electronic equipment; temperature detection means for detecting the temperature or the ambient temperature of the battery which is integrated into the electronic equipment; operation mode detection means for detecting an operation mode of the equipment; and memory means for storing previously therein the discharge characteristic data with the temperature or the ambient temperature of the battery relating to plural different types or capacities of batteries as a parameter in the form of a data table, wherein the discharge temperature characteristic data corresponding to the type and capacity of the battery detected by the detection means, the temperature or the ambient temperature of the battery and the operation mode of the equipment is selected, and on the basis of the discharge temperature characteristic data thus selected, the indication of the remaining power of the battery, the warning about the low power of the battery, the control for limitation of the operation, and the like are carried out.

As a result, according to the present invention, for the battery which is selected arbitrarily by a user, the display of the remaining power of the battery, the warning about the low power of the battery, the control for limitation of the operation, and the like can be more accurately carried out.

In addition, the above-mentioned fourth object is attained in such a way that means for correcting the discharge end detection voltage used to judge the remaining power of the battery in accordance with the current of the battery at the time of judgement is provided and the remaining power of the battery is judged using the discharge end detection voltage thus corrected.

The above-mentioned means serves in such a way that the discharge end detection voltage for judgement of the remaining power of the battery is decreased in accordance with increase of the battery current.

As a result, the discharge end detection voltage for judgement of the remaining power of the battery can be reduced in the range in which the malfunction does not occur in the electronic equipment due to the temporary reduction of the power source voltage, and the power remaining in the battery can be further effectively utilized, and hence the prolongation of the operating time by the battery can be obtained.

In addition, in order to attain the above-mentioned fifth object, means for generating a magnetic force generating means in the battery side, and also means for detecting a magnetic force generated by the magnetic force generating means to detect the type and capacity of the battery is provided in the electronic equipment side so that the means for detecting the type and capacity of the battery can detect the type and capacity of the battery without coming mechanically, electrically in contact with both the electronic equipment and the battery.

Therefore, according to the present invention, it is possible to provide small, light and inexpensive electronic equipment for enabling the different types of batteries to be selectively used which is capable of detecting different types and capacities of batteries without providing both the electronic equipment side and the battery side with terminals used to detect different types and capacities of batteries by coming in contact therewith.

BRIEF DESCRIPTION OF THE DRAWINGS

The above and other objects as well as advantages of the present invention will become clear by the following description of the preferred embodiments of the present invention with reference to the accompanying drawings, wherein.

DESCRIPTION OF THE PREFERRED EMBODIMENTS

The preferred embodiments of the present invention will hereinafter be described in detail with reference to the accompanying drawings.

Figure 1:
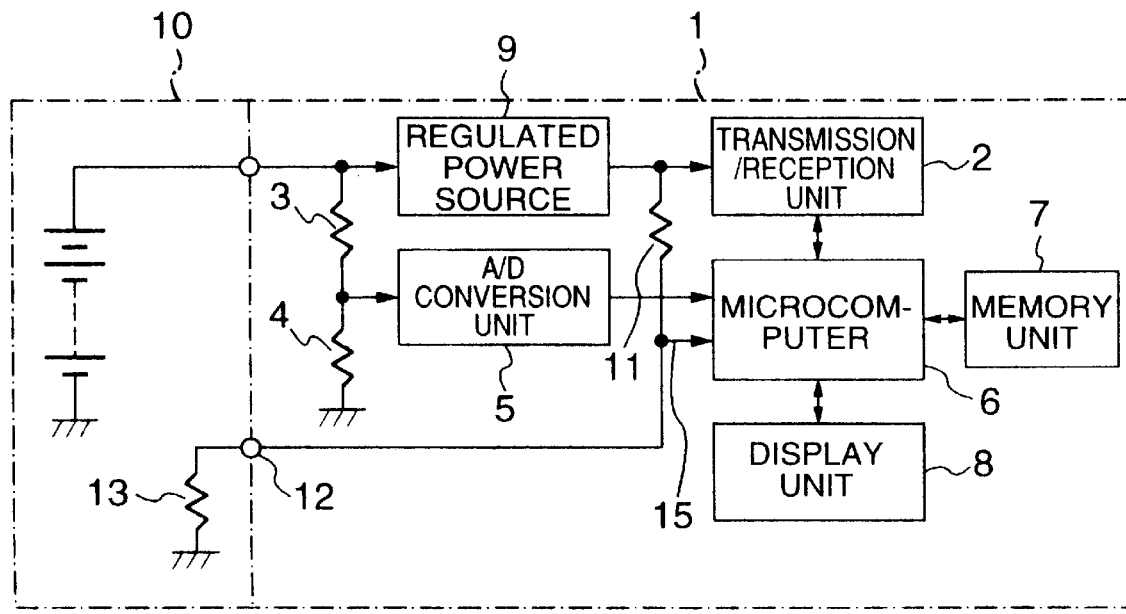
FIG. 1 is a block diagram, partly in circuit diagram, showing a configuration of an embodiment of the present invention.

Referring to FIG. 1, there is shown a block diagram exhibiting a configuration of a portable radio apparatus of a first embodiment of the present invention. In FIG. 1, units or parts similar to those previously described with reference to FIG. 3 are denoted by the same reference numerals.

Figure 3:
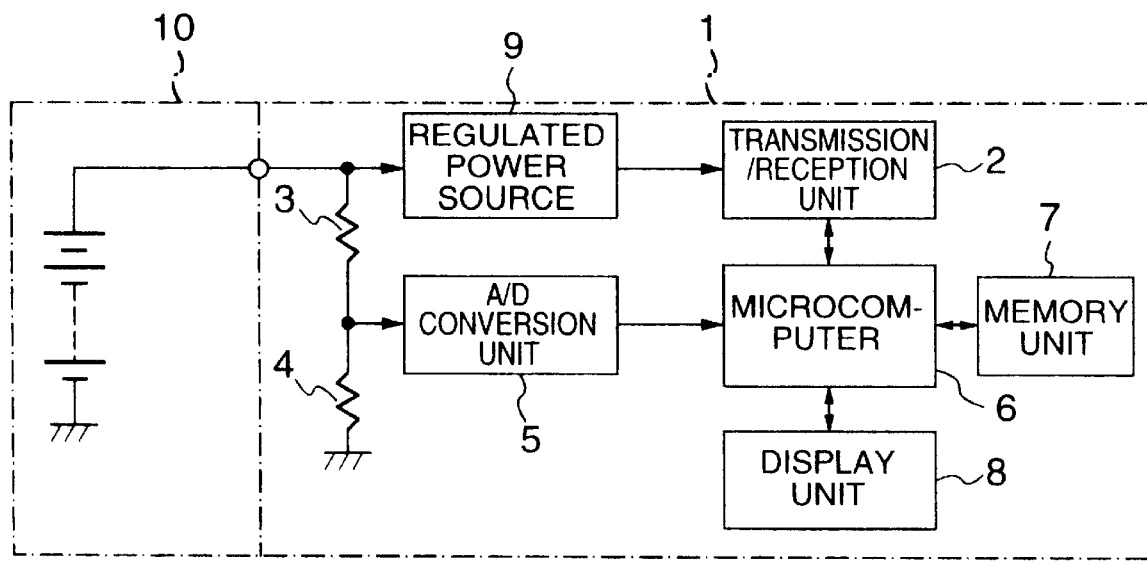
FIG. 3 is a block diagram, partly in circuit diagram, showing a configuration of a typical example of a conventional portable radio apparatus.
Figure 4:
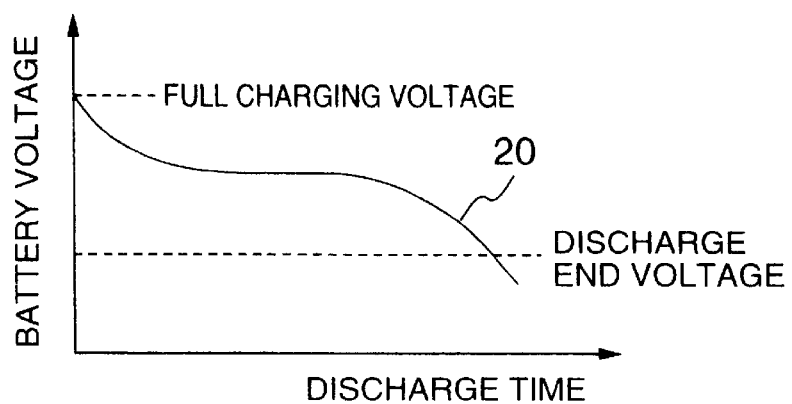
FIG. 4 is a graphical representation showing a typical example of discharge characteristic data of a battery integrated into electronic equipment.
Figure 5:
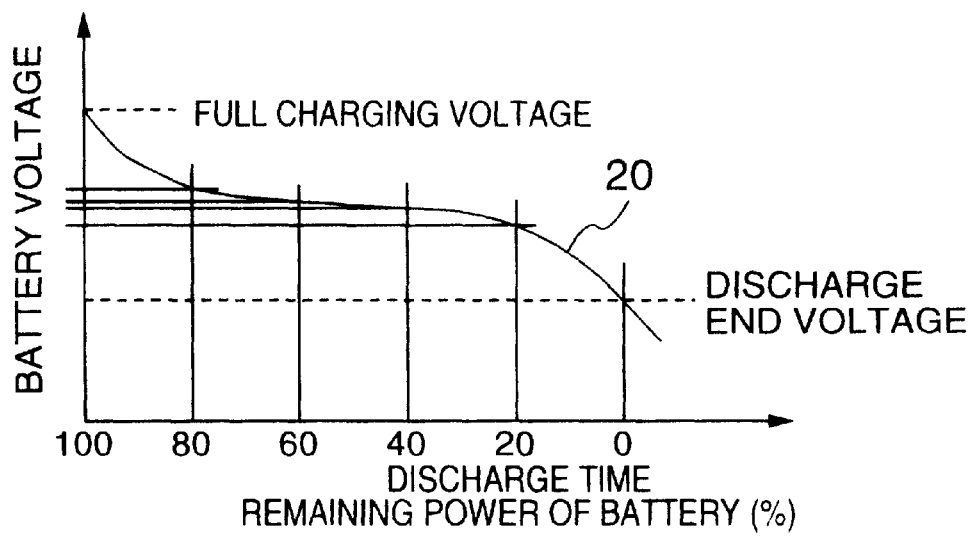
FIG. 5 is a graphical representation useful in explaining a method of displaying a remaining power of a battery on the basis of the discharge characteristic data shown in FIG. 4.

In a microcomputer 6, the operation of comparing the data relating to the discharge characteristics of a battery 10 or the data relating to the voltage range for indication of a remaining power of the battery 10 which is stored in a memory unit 7 with the data relating to the power source voltage which has been obtained by the A/D conversion in an A/D conversion unit 5, and carrying out the indication of a remaining power of the battery, the warning about the low power of the battery and the control for limitation of the operation is the same as that of the prior art shown in FIG. 3, and therefore the description thereof is omitted here for the sake of simplicity.

In a radio apparatus 1 shown in FIG. 1, the microcomputer 6 is provided with a detection port 15 which is connected to an output terminal of a regulated power source unit 9 through a resistor 11 as well as to a detection terminal 12.

Next, the description will hereinbelow be given with respect to a method of discriminating, when two types of batteries which are different in type or capacity from each other can be used in the present radio apparatus, between the two types of batteries.

A battery 10 is a battery pack or a battery case in which one or more battery cells are accommodated and also a resistor 13 is incorporated. The resistor 13 has a resistance value which is either much larger or much smaller than that of the resistor 11. That is, with respect to the two types of batteries, for one type of battery, the resistor having a sufficiently large resistance value is employed, whereas for the other type of battery, the resistor having a sufficiently small resistance value is employed.

When such a battery pack is integrated into the radio apparatus, the detection terminal 12 is grounded through the resistor 13.

When the battery 10 self-containing either the resistor 13 which has a resistance value much smaller than that of the resistor 11 provided in the radio apparatus 1, or the resistor 13 which substantially shortcircuits is integrated into the radio apparatus 1, the voltage level at the detection terminal 12 goes to a LOW level (hereinafter, referred to as "a level L", when applicable). On the other hand, when the battery 10 self-containing either the resistor 13 which has a resistance value much larger than that of the resistor 11 in the radio apparatus 1, or the resistor 13 which is substantially open-circuit is integrated into the radio apparatus 1, the voltage level at the detection terminal 12 goes to a HIGH level (hereinafter, referred to as "a level H", when applicable). The signal at a level H or L on the detection terminal 12 is supplied to the microcomputer 6 through the detection port 15. By detecting the signal at a level H or L, the microcomputer 6 can discriminate between the two types of batteries. For example, in the case where the prepared batteries 10 are two types of batteries, i.e., a Ni-Cd series secondary battery and a Li ion series secondary battery, and in the case where the prepared batteries 10 are two types of batteries, i.e., the Ni-Cd series secondary batteries which are identical in type to each other but is different in capacity from each other, it is possible to identify which battery is integrated into the radio apparatus 1.

On the other hand, the data relating to the discharge characteristics or the data relating to the voltage range for indication of a remaining power corresponding to the above-mentioned two types of batteries (i.e., the Ni-Cd series secondary battery and the Li ion series secondary battery), respectively, is previously stored in the memory unit 7.

Figure 6:
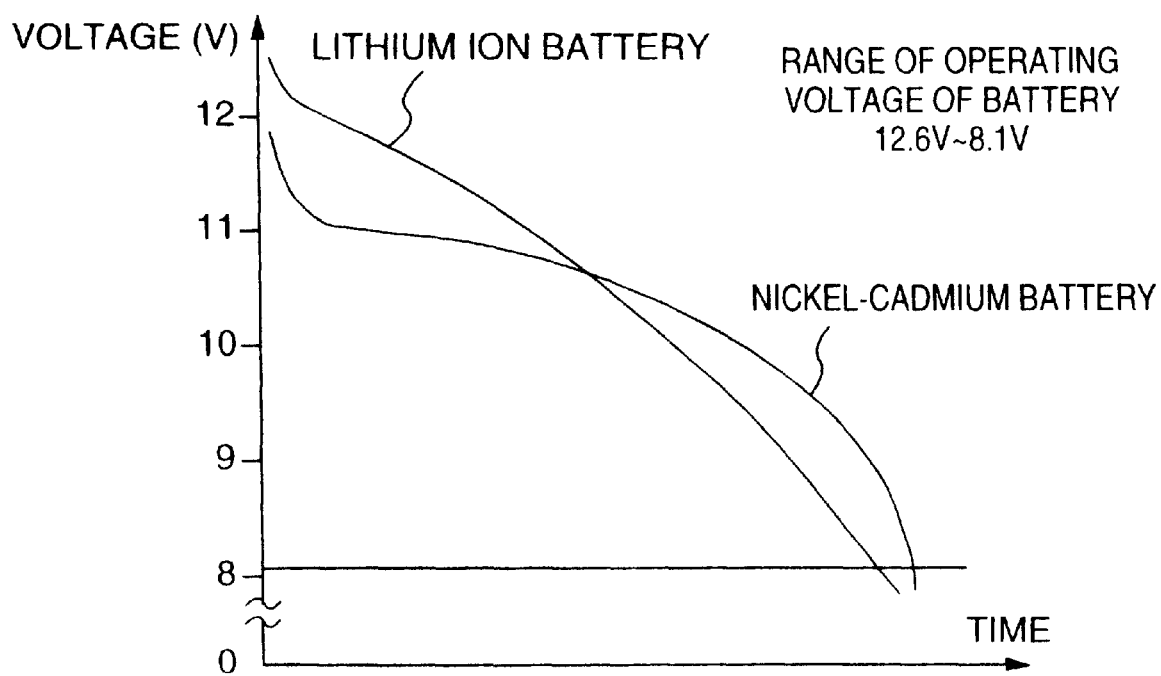
FIG. 6 is a graphical representation showing an example of the data relating to the discharge characteristics of a plurality of batteries which is stored in a memory unit according to the present invention.

Referring to FIG. 6, there is shown an example exhibiting the discharge characteristics of the two types of batteries. For example, the discharge characteristics of the two types of batteries shown in FIG. 6 is converted into the data, and the resultant data is previously stored in predetermined memory areas of the memory unit 7, respectively. Then, when the signal at a level H or L is supplied to the detection port 15 of the microcomputer 6, the microcomputer 6 reads out from the predetermined memory areas of the memory unit 7 the predetermined discharge characteristic data, i.e., the discharge characteristic data of the Ni-Cd series secondary battery in the case of a level H, and the discharge characteristic data of the Li ion series secondary battery in the case of a level L. In such a way, the microcomputer 6 carries out the indication of a remaining power of the battery, the warning about the low power of the battery and the control for limitation of the operation utilizing the discharge characteristic data corresponding to the type of the battery 10 integrated into the radio apparatus.

Figure 2:
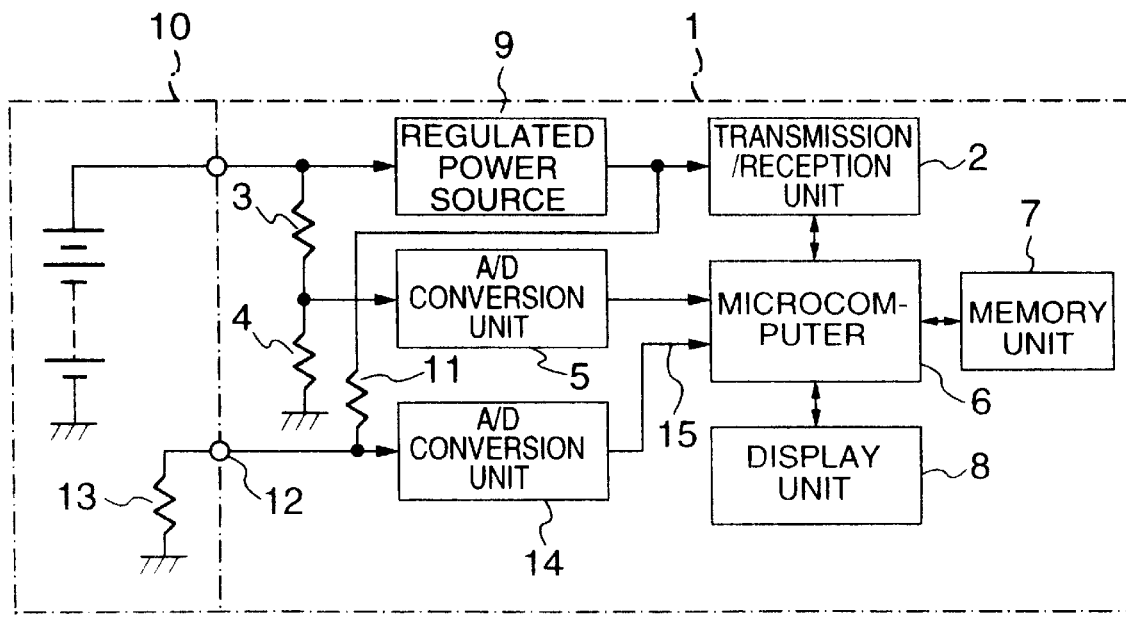
FIG. 2 is a block diagram, partly in circuit diagram, showing a configuration of another embodiment of the present invention.

Referring to FIG. 2, there is shown a block diagram exhibiting a configuration of a second embodiment of the present invention. The second embodiment is designed in such a way that the type of more multiple types (three or more types) of batteries can be detected. In the present embodiment shown in FIG. 2, the battery 10 self-contains a resistor 13 which has a resistance value peculiar thereto every type of a battery 10.

For example, the following classification of the batteries can be considered.

(1) The batteries, which are identical in type to each other but are different in capacity from each other, such as three types of Ni-Cd series batteries which have the capacity of 400 mAh, 600 mAh and 900 mAh, respectively.

(2) The batteries, which are different in type from each other but are identical in capacity to each other, such as a Ni-Cd series battery and a Li ion series battery which have the same capacity.

(3) The batteries which are obtained by combination of the above-mentioned batteries (1) and (2) such as combination of a Ni-Cd series battery with 600 mAh capacity and a Li ion series battery with 730 mAh capacity.

In the case where the three types of different batteries A, B and C corresponding to the above-mentioned forms (1), (2) and (3) can be used, the battery packs can self-contain the respective resistors as follows. For example, the resistor 13 which has the infinitely large resistance value, i.e., the resistor 13 which is substantially open-circuit is incorporated in the battery A such that the level of the signal on the detection port goes to a level H. The resistor 13 the resistance value of which is substantially the same as that of the resistor 11 is incorporated in the battery B such that the signal the level of which is half a level H is obtained on the detection port. Further, the resistor 13 which has the resistance value of zero, i.e., is substantially short-circuited is incorporated in the battery C such that the level of the signal on the detection port goes to a level L.

Therefore, the value of the voltage at the detection terminal 12 varies in correspondence to the type of the battery 10 integrated into the radio apparatus. Thus, after that voltage has been converted into a digital signal in the A/D conversion unit 14, the digital signal thus obtained is supplied to the microcomputer 6 through the detection port 15, whereby it is possible to identify the multiple types of batteries. Since the multiple types of discharge characteristic data corresponding to the desired number of batteries is stored in the memory unit 7, the microcomputer 6 can carry out the indication of a remaining power of the battery, the warning of the low power of the battery and the control for limitation of the operation in correspondence to the type of the battery integrated into the radio apparatus.

Figure 7:
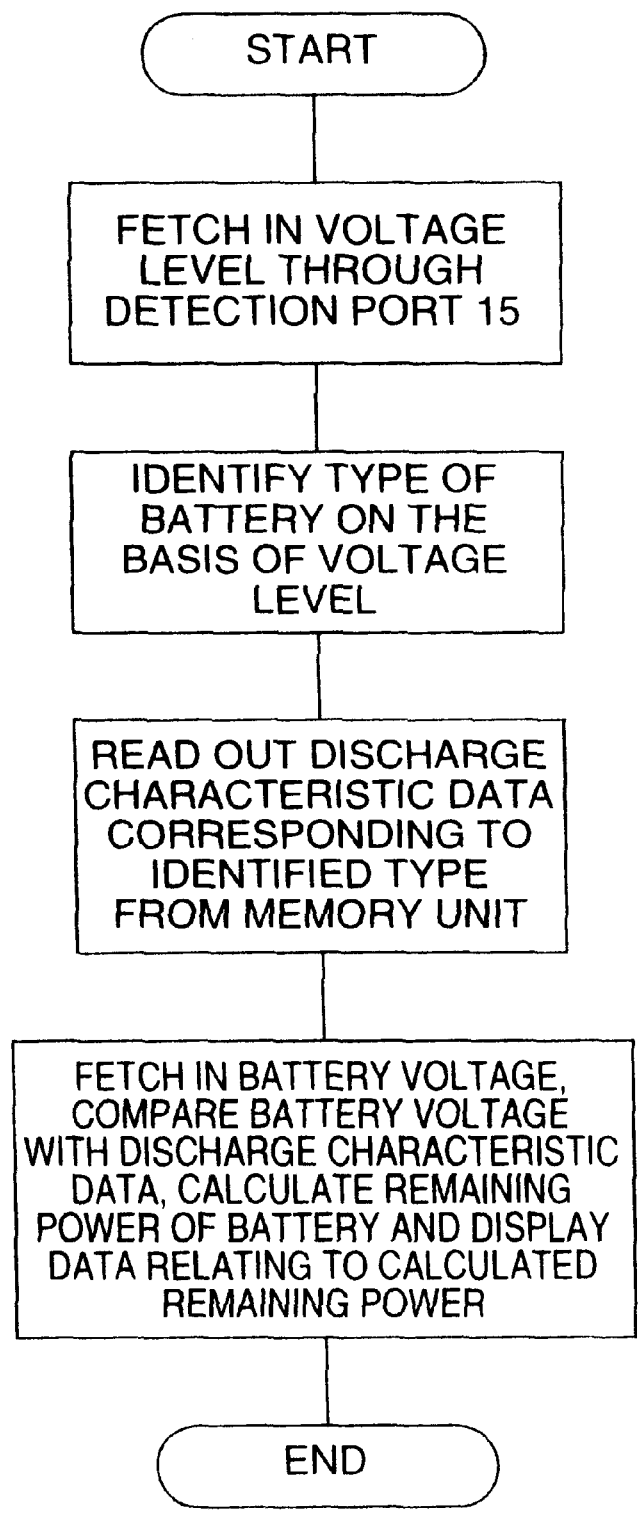
FIG. 7 is a flow chart showing the operation of a microcomputer according to the present invention.
Figure 8:
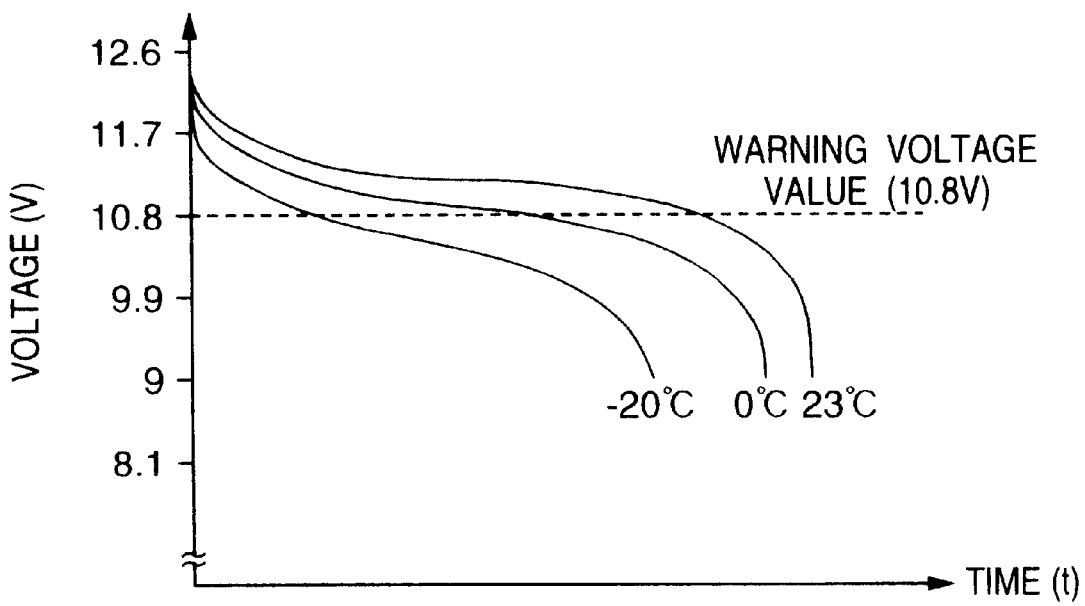
FIG. 8 is a graphical representation showing discharge temperature characteristic data of a Ni-Cd series battery with a temperature as a parameter.
Figure 9:
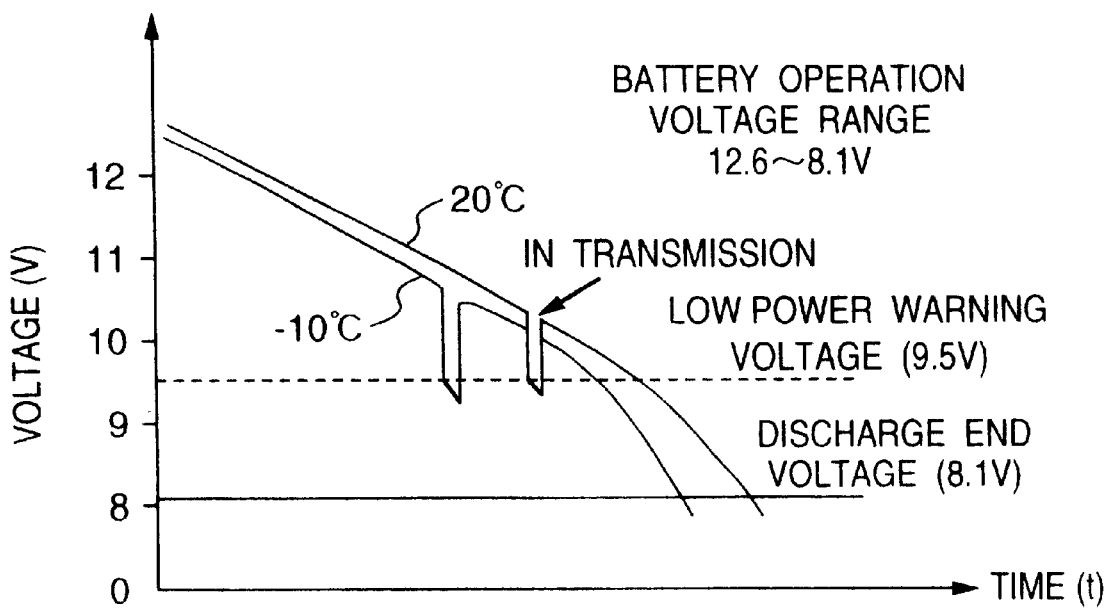
FIG. 9 is a graphical representation showing an example of the voltage change in the transmission operation of a radio apparatus in discharge temperature characteristic data of a Li ion series battery with a temperature as a parameter.

Now, it will be readily understood that the operation of the microcomputer 6, as described above, according to the present invention is carried out on the basis of a flow chart shown in FIG. 7.

While the above description has been given with respect to the structure in which the predetermined battery cells are accommodated in the battery pack or the battery case including the resistor having its own resistance value corresponding to those battery cells, this is the only one of the embodiments, the present invention is not limited by this embodiment. If the battery cell will appear in future which self-contains an identification element used to indicate the type of the battery, then the type of the battery may also be identified utilizing such an identification element.

For example, it is possible to use a capacitor having its own capacity or a coil having its own inductance in each type of battery pack, as an identification element. Moreover, it is possible to use not only the electrical component such as the resistance, capacitor, coil, but also mechanical means.

For example, while a lug is attached to an each battery pack in its own position corresponding to the type of the battery, plural switches are mounted on the electronic equipment. When the battery pack is connected to the electronic equipment, the lug turns on one of the switches for detecting the type of the battery.

As described above, the detection means for detecting the type and capacity of the battery integrated into the radio apparatus and the memory unit for storing previously discharge characteristic data relating to the batteries having different types or capacity in the form of a data table are provided, and the discharge characteristic data corresponding to the detected type and capacity of the battery is selectively fetched from the data table, whereby the indication of a remaining power of the battery, the warning about the low power of the battery, the control for limitation of the operation and the like can be carried out with high accuracy and irrespective of the type of the battery integrated into the radio apparatus. Therefore, the user can confirm accurately the remaining power of the battery, and hence the memory effect and the over discharge of the battery can be effectively prevented.

As set forth hereinabove, according to the present invention, since the display of a remaining power of the battery, the warning about the low power of the battery, the control for limitation of the operation and the like can be carried out with high accuracy and irrespective of the type of the battery, it is possible to realize the electronic equipment with which the user can selectively use the different types of batteries and which is very excellent in utilization.

Therefore, even if the user uses a plurality types of different batteries, user can always grasp accurately the remaining power of the battery, and also use the full capacity of the battery. As a result, in particular, it is possible to prevent the memory effect which becomes a problem in the nickel series secondary battery. In addition, by preventing the over discharge, it is possible to avoid the risk such as explosion which becomes a problem in the lithium series secondary battery. Accordingly, the present invention can be applied to all the battery chargers for use in the electronic equipment, and hence has a wide range of application.

While the present invention has been described in its preferred embodiments, it is to be understood that the words which have been used are words of description rather than limitation and that changes within the purview of the appended claims may be made without departing from the true scope and spirit of the invention in its broader aspects.

The description will hereinafter be given with respect to embodiments of the present invention, in which the change in the temperature, the change in the operation mode of the electronic equipment, and the like are suitably taken into consideration for the above-mentioned embodiments, with reference to the related drawings.

Figure 11:
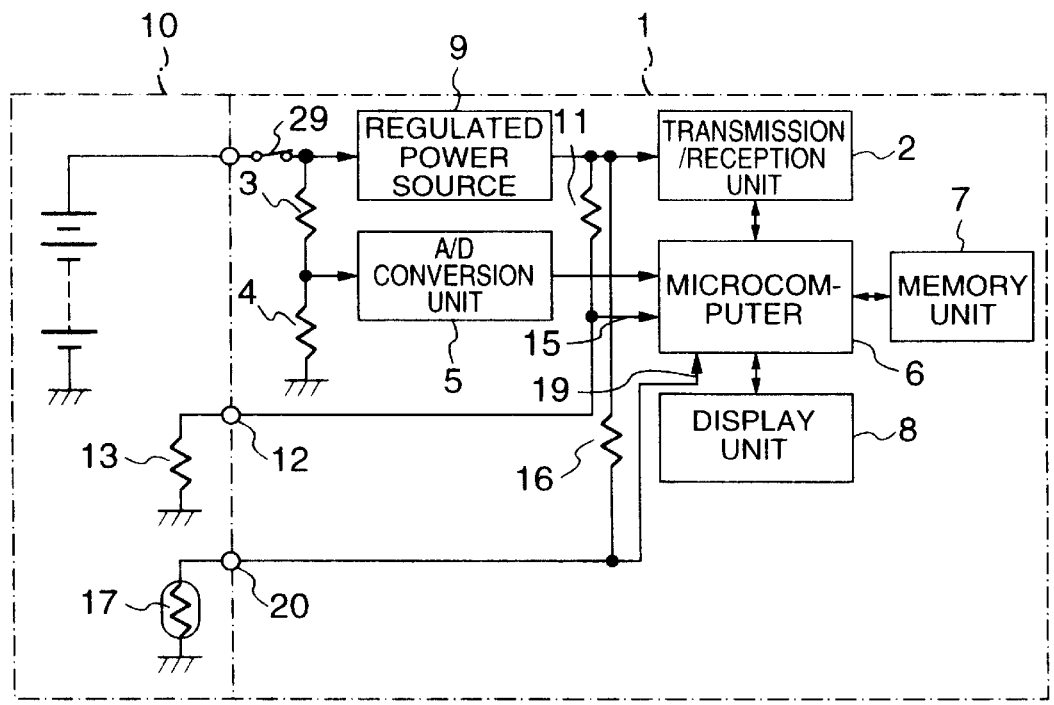
FIG. 11 is a block diagram, partly in circuit diagram, showing a configuration of a third embodiment of the present invention.

FIG. 11 is a block diagram, partly in circuit diagram, showing a configuration of a portable radio apparatus of a third embodiment according to the present invention, and blocks and parts corresponding to those of FIG. 3 are denoted by the same reference numerals. In the figure, reference numeral 10 designates a battery and reference numeral 1 designates a radio apparatus as a load apparatus which is powered by the battery 10. In FIG. 11, the discharge characteristic data in the transmission mode and the reception/waiting mode in accordance with temperature of the battery or the ambient temperature and a plurality of types of batteries as a parameter are stored in the memory unit 7 provided within the radio apparatus 1.

Figure 14:
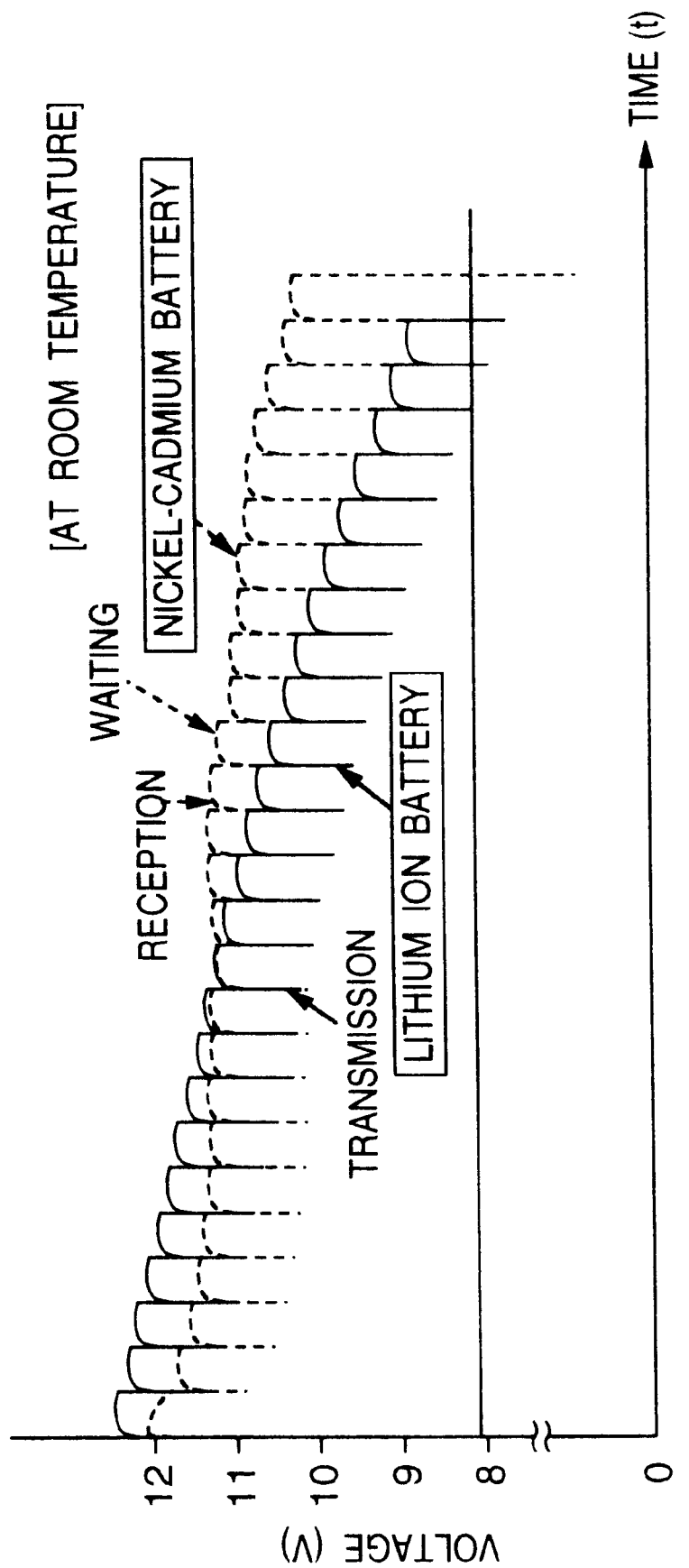
FIG. 14 is a graphical representation showing an example of discharge characteristic data of a plurality of batteries at a room temperature which data is stored in a memory unit according to the present invention.

The discharge characteristic data include not only the discharge curve data of batteries to be used as shown in FIG. 14 but also the threshold voltage data for the low power warning and discharge end voltage.

The microcomputer 6 compares the power source voltage data which has been obtained through the A/D conversion in the A/D conversion unit with the data relating to the operation mode of the transmission/reception unit 2 and the temperature of the battery in order to carry out the indication of the remaining power of the battery, the warning about the low power of the battery and the control for limitation of the operation.

In addition, in the radio apparatus 1 shown in FIG. 11, the microcomputer 6 is provided with detection ports 15 and 19. The detection port 15 is connected to the output of the regulated power source 9 through a resistor 11 and also is connected to a detection terminal 12. On the other hand, the detection port 19 is connected to the output of the regulated power source 9 through a resistor 16 and also is connected to a detection terminal 20.

The description will hereinbelow be given with respect to a method of discriminating between two types of batteries and a method of detecting the temperature of the battery or the ambient temperature in the case where the two types of batteries having different types or different capacities can be used in the radio apparatus of interest.

The battery 10 is a battery pack or a battery case which accommodates therein one or a plurality of battery cells and which incorporates therein both a resistor 13 and a thermistor 17 a resistance value of which varies depending on the temperature. The resistance value of the resistor 13 is much larger than that of a resistor 11 or much smaller than that of the resistor 11. When such a battery pack is integrated into the radio apparatus, the detection terminals 12 and 20 are grounded through the resistor 13 and the thermistor 17, respectively.

When the battery 10 is integrated into the radio apparatus, the detection terminal 20 exhibits the voltage into which the regulated power source voltage is divided by the resistor 16 and the thermistor 17 and which is peculiarly determined depending on the temperature. Then, this voltage at the detection terminal 20 is supplied to the microcomputer 6 through the detection port 19. Now, the thermistor 17 exhibits such characteristics that its resistance value is increased as the temperature is further reduced. For example, when the temperature is detected on the basis of whether the temperature of the battery 10 or the ambient temperature is higher or lower than 0° C., the resistance value of the resistor 16 is set to the resistance value of the thermistor 17 at 0° C. As a result, when the resistance value of the thermistor 17 is changed depending on the temperature, the detection terminal 20 goes to a level $\underline{H}$ or a level $\underline{L}$ depending on whether the resistance value of the thermistor 17 is larger or smaller than the resistance value of the resistor 16. The signal at the level $\underline{H}$ or the level $\underline{L}$ at the detection port 20 is supplied to the micro-computer 6 via the detection port 19. By detecting the signal at the level $\underline{H}$ or the level $\underline{L}$, it is possible to detect the temperature of the battery which is equal to or higher or equal to or lower than 0° C. in the microcomputer 6. In addition, while in the present 25 embodiment, the means for measuring a temperature of a battery has been described by taking the thermistor by an example, it should be noted that the means is not particularly limited to the thermistor in the present invention.

Figure 13:
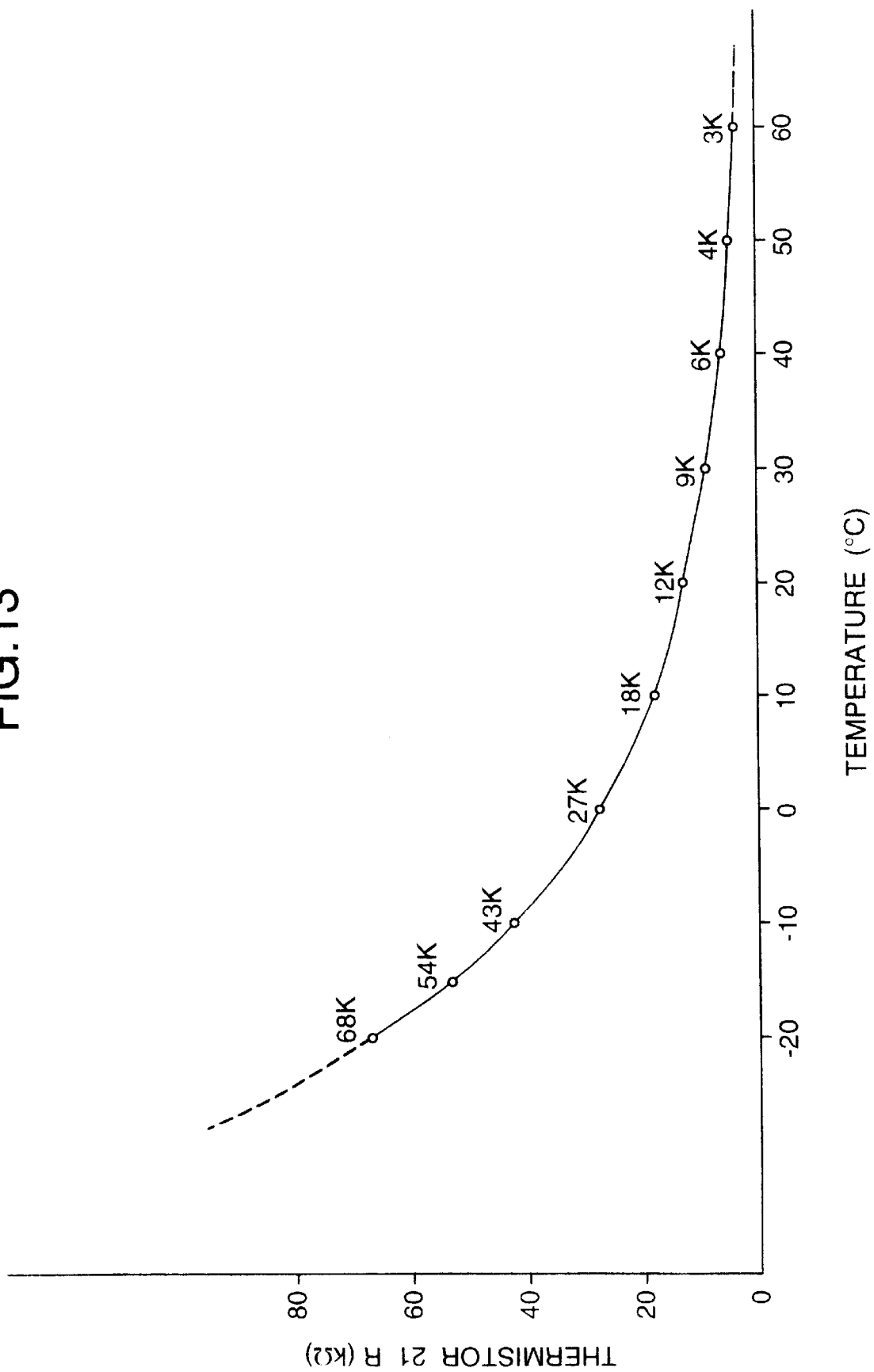
FIG. 13 is a graphical representation showing an example of the relation between the temperature or the ambient temperature of a battery and the detected voltage developed across detection terminals in the third and fourth embodiments.

Now, the relationship between the voltage detected at the above-mentioned detection terminal 20 and the ambient temperature which is judged in correspondence to the detected voltage by the microcomputer 6 has the correspondence relation shown in FIG. 13 if exemplified.

In addition, while the method of judging the current operation mode of the transmission/reception unit 2 by the microcomputer 6 may be variously considered, for example, in the case of the simplex transceiver, the judgement can be readily carried out if the following method is adopted.

That is, the correspondence table as shown in the following Table 1 is previously prepared. Then, when judging the current operation mode of the transmission/reception unit 2, the microcomputer 6 detects both the level of a press-to-talk switch signal 20 of the transmission portion in the transmission/reception unit 2 and the level of a squelch signal of the reception portion therein and compares the detection result with the contents of the correspondence table of Table 1, thereby being able to judge readily the current operation mode of the transmission/reception unit 2.

During waiting mode as shown in Table 1, the transmission/reception unit 2 doesn't either transmit a send signal or receive a receive signal. It waits for being applied the send signal or the receive signal in waiting mode.

Incidentally, the method of judging the current operation mode of the transceiver is not limited to the above-mentioned method. For example, even in the case of the transceiver which is more complicated in the switching of the operation mode than the above-mentioned simplex transceiver, such a procedure may be adopted that the correspondence table for judging the operation mode is previously prepared which follows basically Table 1, and then the corresponding operation mode is judged on the basis of the result of detecting both the signal levels of the transmission portion and the reception portion.

TABLE 1

|  |  | press-to-talk switch signal level | |
|---|---|---|---|
|  |  | H (switch OFF) | L (switch ON) |
| squelch signal level | H (un-mute) | reception | transmission |
|  | L (mute) | waiting | transmission |

On the other hand, the current values in the transmission mode of the radio apparatus, and the discharge temperature characteristic data or the remaining power display data in the reception mode and the waiting mode thereof which correspond to the above-mentioned two types of batteries (Ni-Cd series battery and Li ion series battery), respectively, are previously stored in the memory unit 7.

In addition, FIG. 14 shows the discharge temperature characteristics of those two types of batteries at 20° C. when those two types of batteries are used with the ratio that the interval of the transmission mode:the interval of the reception mode:the interval of the waiting mode as the operation modes of the radio apparatus is 1 min.:1 min.:18 min. In FIG. 14, there are shown the discharge temperature characteristics of the lithium ion series battery (3.6V×3 cells) and the Ni-Cd series battery (1.2V×9 cells) when the transmission power is 5 W, the consumed current in transmission is 1,300 mA, the consumed current in reception is 150 mA and the consumed current in waiting is 30 mA. In the memory unit 7, the discharge temperature characteristics of the two types of batteries shown in FIG. 14 are stored in the form of data in the predetermined areas of the memory, respectively. Then, as described above, when the detection port 15 of the microcomputer 6 is given the signal at the level $\underline{H}$ or the level $\underline{L}$, if the signal is at the level $\underline{H}$ for example, then the microcomputer 6 reads out the discharge temperature characteristic data of the Ni-Cd series secondary battery in the transmission mode or the reception/waiting mode which mode is determined depending on the operation mode of the transmission/reception unit 2, while if the signal level is at the the level $\underline{L}$, then the microcomputer 6 reads out the discharge temperature characteristic data of the Li ion series battery corresponding to the transmission mode or the reception/waiting mode which mode is determined depending on the operation mode of the transmission/reception unit 2. In such a way, the microcomputer 6 reads out the predetermined discharge temperature characteristic data from the predetermined area of the memory unit 7. Thus, the microcomputer 6 carries out the indication of the remaining power of the battery, the warning about the low power of the battery and the control for limitation of the operation using the discharge temperature characteristic data corresponding to the type of the battery 10 which is integrated into the radio apparatus 1 on the basis of the operation mode of the radio apparatus. For example, various threshold voltage values at which the warning about the low power of the battery are issued are set as in Table 2 and are pre-stored in the memory. The threshold voltage data become different depending on the batteries. In the case of the lithium ion series battery, the threshold voltage in the transmission mode is set to a level lower than the threshold voltage in the reception mode by the voltage drop. At a lower temperature, the voltage drop is increased. Then, the threshold voltage data is set to the level which is corrected depending on whether the signal at the detection port 19 of the microcomputer 6 is at the level H or the the level L, i.e., whether the temperature is equal to or higher than 0° C. or equal to or lower than 0° C. In addition, in the case of the Ni-Cd series battery, since the change in the internal impedance due to the temperature is less, the warning voltage is corrected only in the transmission mode and the reception mode.

Moreover, various threshold voltage values for the discharge end voltages of batteries are pre-stored in Memory Unit 7. The threshold data depends on temperature of the battery 10, mode of transmission/reception Unit 2 and the types of batteries to be used. Microcomputer 6 reads out one of the threshold data on the basis of a detected temperature of the battery, a detected mode and a detected type of the battery. When the microcomputer 6 detects that the voltage level of the battery is lower than the read out threshold data, the microcomputer 6 controls a power switch 29 to stop the electric power from the battery 10 for protection of the battery 10 and the load equipment 1.

TABLE 2

|  | operation mode | 0° C. or lower | 0° C. or higher |
|---|---|---|---|
| Li ion battery | reception/ waiting | 10.2 V | 9.8 V |
|  | transmission | 9.2 V | 9.5 V |
| Ni—Cd battery | reception/ waiting | 10.0 V | |
|  | transmission | 9.5 V | |

In addition, in the case of the radio apparatus in which the transmission power can be changed ranging from 1 W up to 5 W, the transmission current in the transmission mode is changed and also the ratio in which the voltage drops becomes different therefrom. In order to cope with this situation, the discharge temperature characteristic data corresponding to the transmission power is previously stored in the memory unit 7. Then, when the radio apparatus of interest is used with the transmission power of 1 W, the discharge temperature data of 1 W is read out from the memory unit 7, while when the radio apparatus of interest is used with the transmission power of 5 W, the discharge temperature data of 5 W is read out from the memory unit 7, whereby the indication of the remaining power of the battery, and the like are carried out. As a result, it is possible to attain the commonness for the apparatuses. In addition, the control is carried out in such a way that normally, the radio apparatus of interest is used with the transmission power of 5 W, and when the remaining power of the battery becomes low, the transmission power is reduced, whereby the operating time of the battery can also be prolonged. In such a way, since the characteristics depend on the battery, the various controls are possible.

Figure 12:
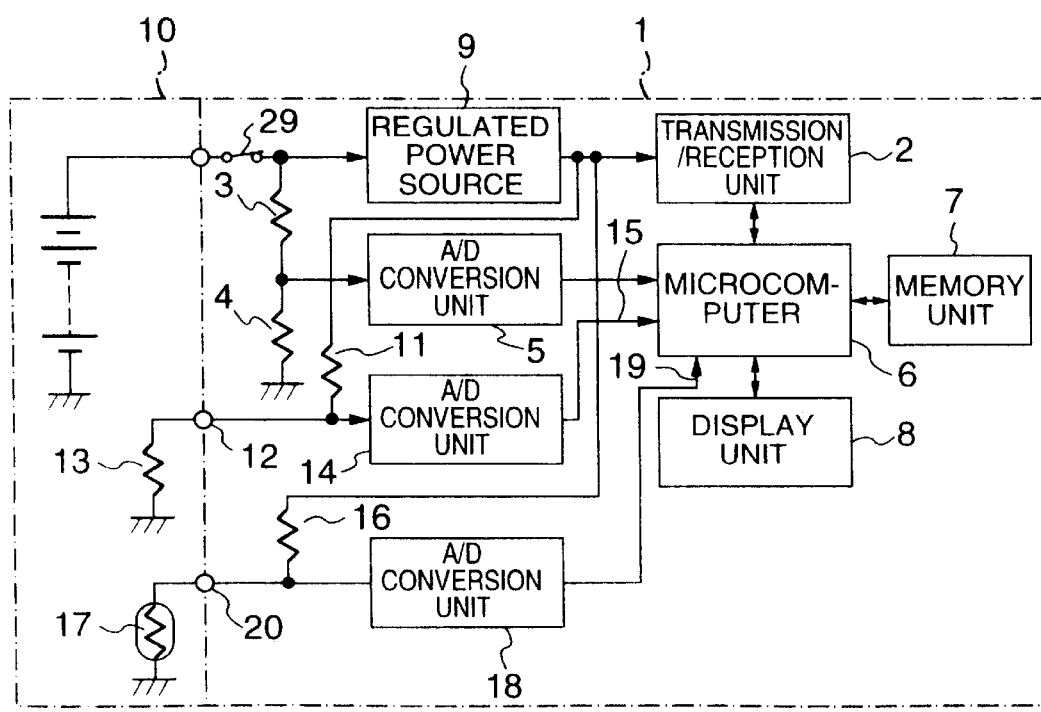
FIG. 12 is a block diagram, partly in circuit diagram, showing a configuration of a fourth embodiment of the present invention.

FIG. 12 is a block diagram, partly in circuit diagram, showing a configuration of a fourth embodiment of the present invention which is designed in such a way as to be able to detect the multiple types of batteries (equal to or more than three types), and to detect more minutely the temperature of the battery or the ambient temperature.

In the fourth embodiment, the battery 10 self-contains a resistor 13 which has a peculiar resistance value every type of the battery 10.

For example, as for the type of the battery, the following classification of the batteries can be considered.

(1) The batteries, which are identical in type to each other but are different in capacity from each other, such as three types of Ni-Cd series batteries which have the capacity of 400 mAh, 600 mAh and 900 mAh, respectively.

(2) The batteries, which are different in type from each other but are identical in capacity to each other, such as a Ni-Cd series battery and a Li ion series battery which have the same capacity.

(3) The batteries which are obtained by combination of the above-mentioned batteries (1) and (2) such as combination of a Ni-Cd series battery with 600 mAh capacity and a Li ion series battery with 730 mAh capacity.

In the case where the three types of different batteries A, B and C corresponding to the above-mentioned forms (1), (2) and (3) can be used, the battery packs can self-contain the respective resistors as follows. For example, the resistor 13 which has the infinitely large resistance value, i.e., the resistor 13 which is substantially open-circuit is incorporated in the battery A such that the level of the signal on the detection port goes to a level H. The resistor 13 the resistance value of which is substantially the same as that of the resistor 11 is incorporated in the battery B such that the signal the level of which is half a level H is obtained on the detection port. Further, the resistor 13 which has the resistance value of zero, i.e., is substantially short-circuited is incorporated in the battery C such that the level of the signal on the detection port goes to a level L. Therefore, the value of the voltage at the detection terminal 12 varies in correspondence to the type of the battery 10 integrated into the radio apparatus. Thus, after that voltage has been converted into a digital signal through the A/D conversion in the A/D conversion unit 14, the digital signal thus obtained is supplied to the microcomputer 6 through the detection port 15, whereby it is possible to identify the multiple types of batteries.

In addition, the value of the voltage at the detection terminal 20 which varies depending on the temperature of the battery or the ambient temperature is subjected to the A/D conversion in the A/D conversion unit 18 and then is supplied to the microcomputer 6 through the detection port 19, whereby the temperature of the battery or the ambient temperature can be more minutely detected. The multiple types of discharge temperature characteristic data corresponding to the desired number of batteries is stored in the memory unit 7 and is used to carry out the indication of the remaining power of the battery, the warning about the low power of the battery, the control for limitation of the operation, and the like which correspond to the battery integrated into the radio apparatus.

It will be readily understood that the operation of the microcomputer 6 relating to the third and fourth embodiments of the present invention described above follows a flow chart shown in FIG. 15A.

Figure 15A:
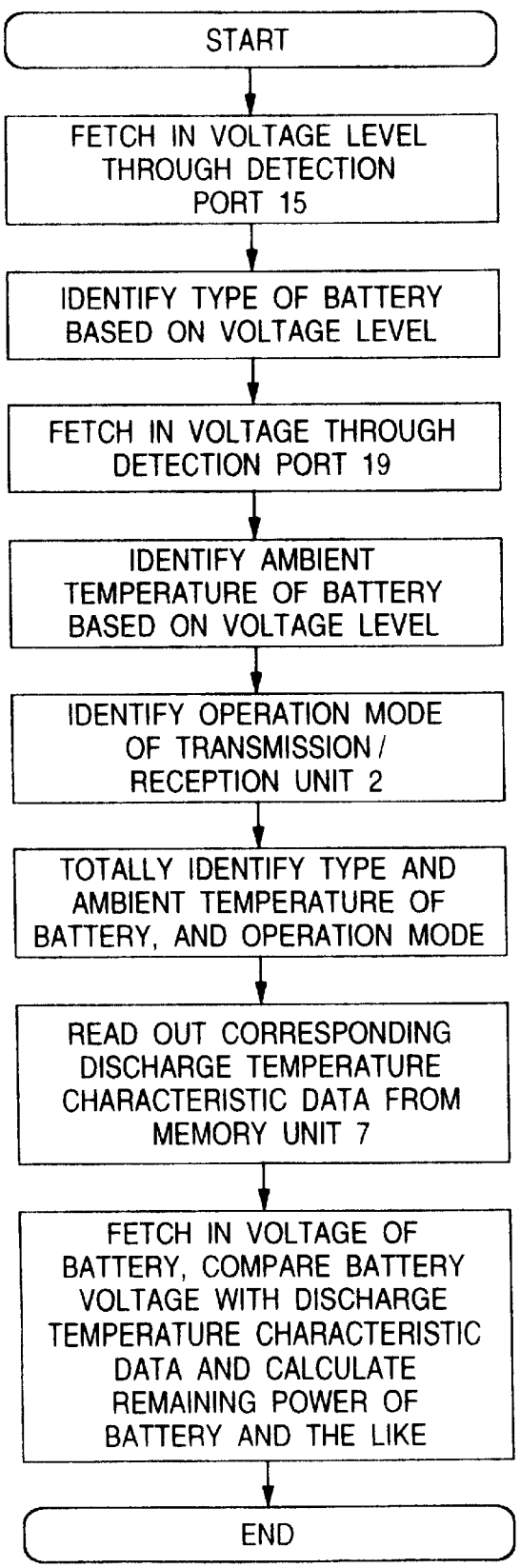
FIGS. 15A and 15B are respectively flow charts each showing the operation of a microcomputer according to the present invention.

As shown in FIG. 15A, the microcomputer 6 detects not only a voltage level signal representative of a type of battery but also a voltage level signal representative of the temperature of the battery and a voltage level signal representative of the operation mode of the load equipment. Moreover, the microcomputer 6 synthetically discriminates the type of the battery, the temperature of the battery and the operation mode of the load equipment on the basis of the detected voltage level signals to read out from the memory unit 7 a discharge characteristic data corresponding to the type of the battery, the temperature of the battery and the operation mode of the load equipment.

A control operation in the flow chart shown in FIG. 15A is described in more detail hereinafter.

The memory unit 7 previously memorizes the following three data tables A, B and C.

Table A: "Temperature Data Table" classified in accordance with the types of batteries to be used.

Table B: "Temperature Data Correction Value Table" classified in accordance with operation modes of load equipments.

Table C: "Discharge Characteristic Data Table" corresponding to the corrected temperature data.

The microcomputer 6 is operated as follows:

1) Reading out a corresponding temperature data $a$ from the table A on the basis of the voltage level signal representative of the type of the battery detected and the voltage level signal representative of the temperature of the battery.
2) Reading out a corresponding temperature data correction value $b$ from the table B on the basis of the voltage level signal representative of the operation mode of the load equipment detected.
3) Calculating a corrected temperature data $c$ on the basis of the temperature data a and the correction value $b$.
4) Reading out a discharge characteristic data $d$ (voltage data) on the basis of the calculated corrected temperature data $c$.
5) Detecting an output voltage level signal $e$ of the battery.
6) Calculating difference between the discharge characteristic data $d$ and the output voltage level signal $e$ of the battery to calculated a remaining power of the battery and control the warning about the low power of the battery and others.

As mentioned above, the calculation of the remaining power of the battery, the warning about the low power of the battery and others can be very accurately controlled.

Additionally, it should be not limited to the above example that the type of the battery, the temperature of the battery and the operation mode of the load equipment are synthetically discriminated and the corresponding discharge characteristic data is read out from the memory unit 7. It is thus understood that various other modifications and combinations of the above operation are possible.

As described above, according to the present invention, by providing: battery type detecting means for detecting a type and capacity of a battery which is integrated into equipment; temperature detection means for detecting a temperature of the battery which is integrated into the equipment or an ambient temperature; operation mode detecting means for detecting an operation mode of the equipment; and memory means for storing previously therein, for a plurality of different types or capacities of batteries, discharge temperature characteristic data of the batteries in the form of a data table with the temperature of the battery and the operation mode of the electronic apparatus as parameters, the indication of the remaining power of the battery, the warning about the low power of the battery, the control for limitation of the operation, and the like can be carried out with very high accuracy irrespective of a type of a battery, the change in the temperature and the change in the operation mode of electronic equipment. Therefore, a user can use selectively different types of batteries in accordance with the application, and hence it is possible to realize electronic equipment which is very excellent in utilization. For this reason, even if a user uses plural different types of batteries selectively, a user can always grasp the accurate remaining power of the battery irrespective of the change in the temperature and the change in the operation mode of electronic equipment and also can utilize the full capacity of the battery. Therefore, in particular, it is possible to prevent the memory effect which becomes a problem in the Ni-Cd series secondary battery. In addition, since the over discharge can be prevented, it is possible to avoid the risk such as explosion which becomes a problem in the Li ion series secondary battery. Accordingly, the present invention can also be applied to a battery charger, for example, for use in the electronic equipment, and hence has a wide range of application.

Further, since the operation control corresponding to the change in the temperature and the change in the operation mode of the electronic equipment is carried out, the number of types of the batteries which can be selectively used can be greatly increased. Therefore, in addition to the effect of improvements in utilization provided for users, though conventionally, different types of products need to be designed and manufactured on the maker side so as to correspond to the types of the batteries which are to be used, since the product can be generalized in accordance with the present invention, the cost of the product can also be reduced along with generalization, and hence the remarkable effect can be obtained.

Figure 16:
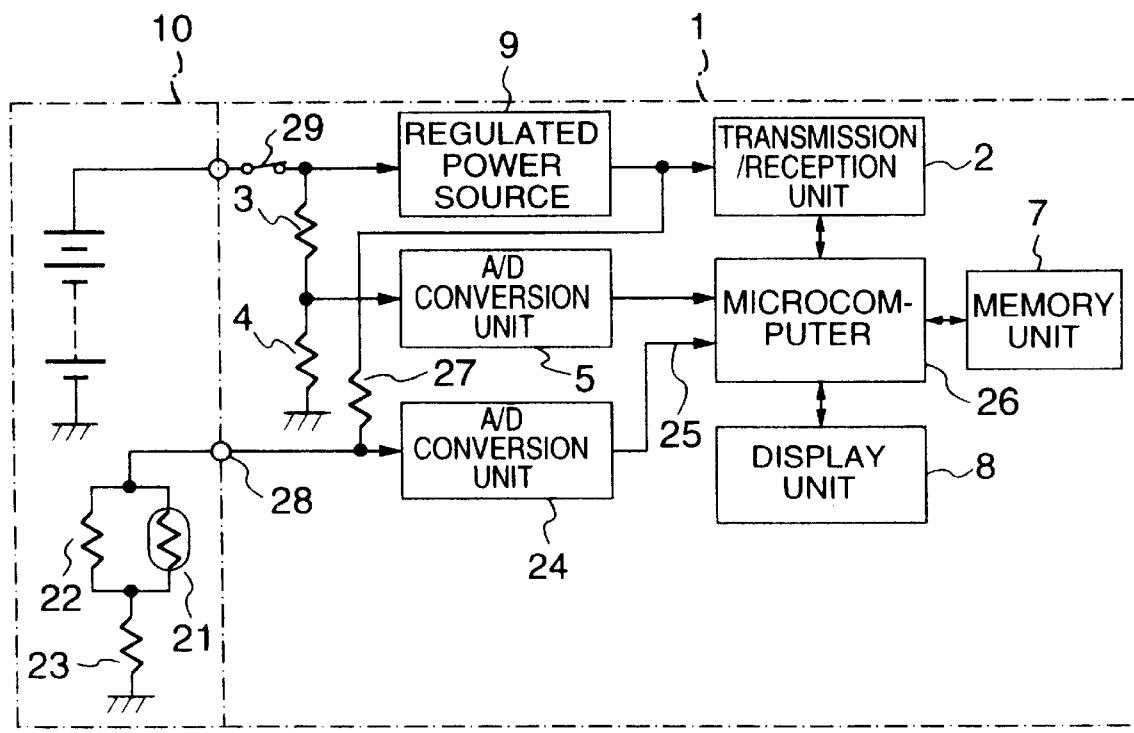
FIG. 16 is a block diagram, partly in circuit diagram, showing a configuration of a fifth embodiment of the present invention.
Figure 17:
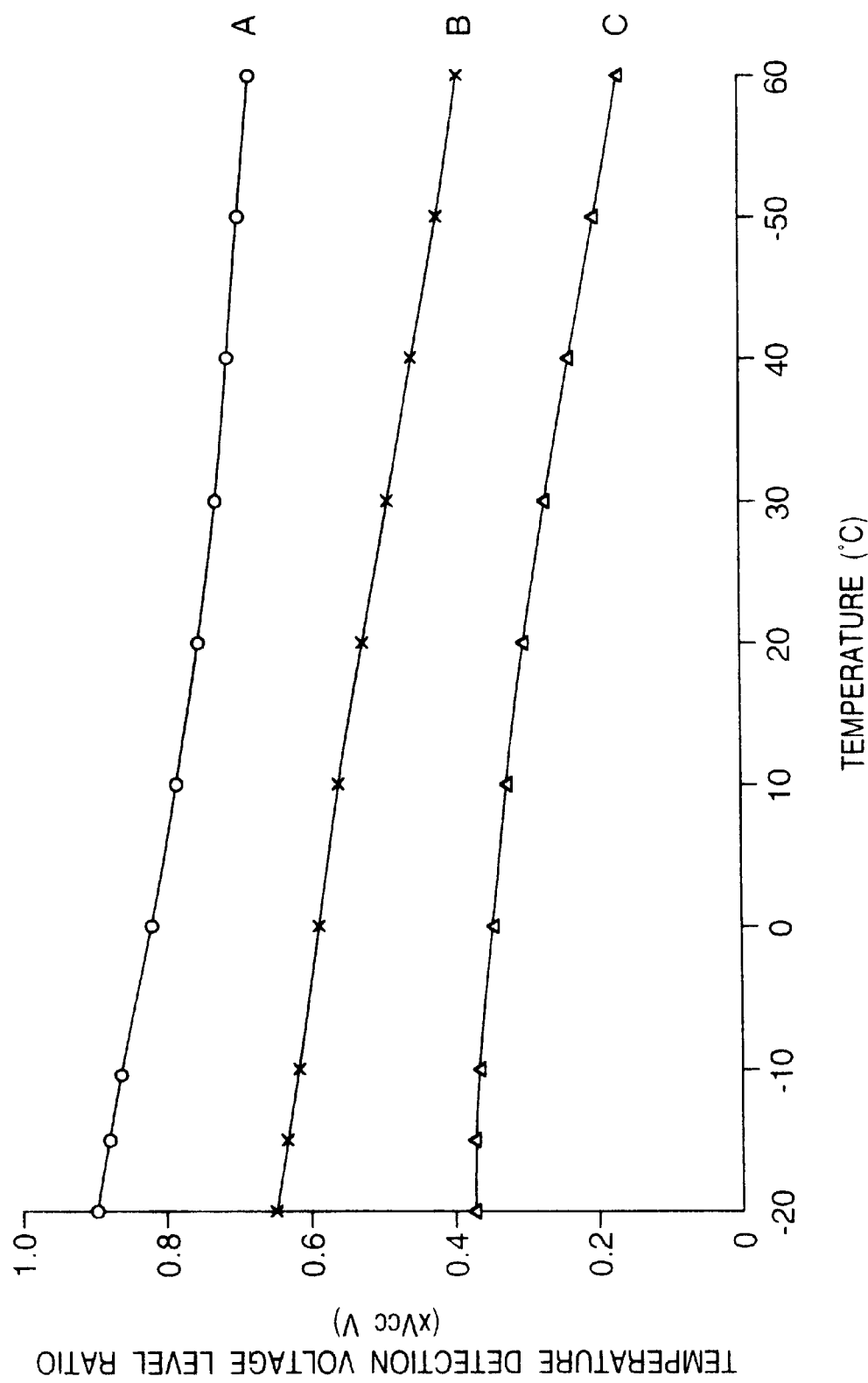
FIG. 17 is a graphical representation showing an example of the relation between the temperature or the ambient temperature of a battery and the detected voltage developed across detection terminals in the fifth embodiment.

FIG. 16 is a block diagram, partly in circuit diagram, showing a configuration of a fifth embodiment of the present invention which is designed in such a way as to be able to detect a type of a battery and a temperature of a battery or an ambient temperature through one detection terminal. In FIG. 16, the battery 10 is a battery pack or a battery case in which a thermistor 21 is connected in parallel with a resistor 22 and a resistor 23 is connected in series with the parallel combination of the thermistor 21 and the resistor 22, the resistors 22 and 23 which have the peculiar resistance values every type of the battery 10 being self-contained therein. For example, in the present embodiment, when three types of batteries $A$, $B$ and $C$ can be used, the resistance value of the thermistor 21 varies depending on the temperature as shown in FIG. 13 in the operating range of —20° C. to 60° C., the output voltage of the regulated power source unit 9 is Vcc, the resistance value of the resistor 27 is 10 kΩ, and the resistance values of the resistors 22 and 23 are respectively set to the peculiar values every type of the battery as shown in Table 3. As a result, the value of the voltage at the detection terminal 28 has the characteristics as shown in FIG. 17. FIG. 17 represents the temperature dependency of the ratio of the detection terminal level with the type of the battery as a parameter. As apparent from FIG. 17, the voltage level at the detection terminal 28 varies depending on the types of the battery and the temperature. Since this voltage value is subjected to the A/D conversion in an A/D conversion unit 24 and then is supplied to a microcomputer 26 through a detection port 25, the multiple types of batteries, the temperature of the battery or the ambient temperature can be detected through one detection terminal, and hence the number of battery terminals and the number of detection ports are reduced, thereby realizing miniaturization of the electronic equipment and the battery. The multiple kinds of discharge temperature characteristic data corresponding to the desired batteries is stored in the memory unit 7 and also is used to carry out the indication of the remaining power of the battery, the warning about the low power of the battery, the control for limitation of the operation, and the like corresponding to the type of the battery which is integrated into the electronic equipment, and the temperature of the battery or the ambient temperature.

TABLE 3

|  | battery A | battery B | battery C |
| --- | --- | --- | --- |
| resistor 22 | absence | 18 kΩ | 6.8 kΩ |
| resistor 23 | 18 kΩ | 3.9 kΩ | 0 |

Figure 15B:
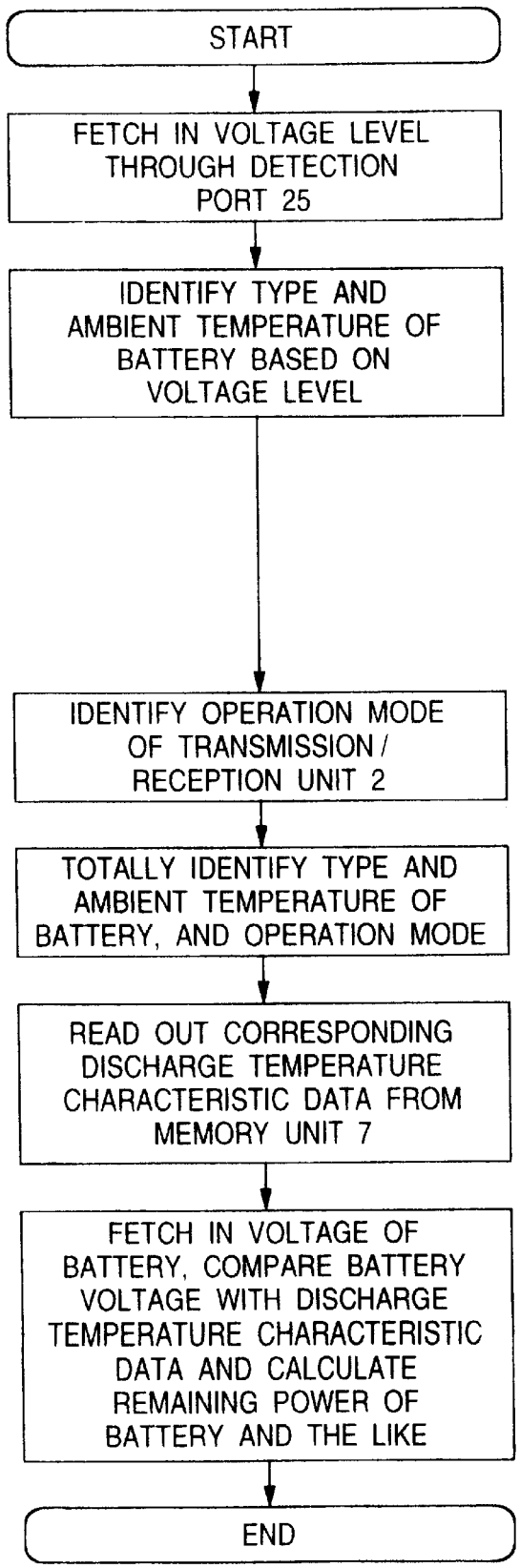

Now, it will be readily understood that the operation of the microcomputer 26 according to the fifth embodiment of the present invention described above follows a flow chart shown in FIG. 15B.

While the above description has been given with respect to the structure in which the battery cells each having the resistance value peculiar to the type thereof are accommodated in the battery pack or the battery case, if the battery cell will appear in future which self-contains an identification component used to identify the type of the battery, then the type of the battery may also be identified utilizing such an identification component.

According to the fifth embodiment, since with respect to the connection terminals between the electronic equipment and the battery, the number of connection terminals can be reduced on both the electronic equipment side and the battery side, the miniaturization, the light weight and the low cost of the electronic equipment and the battery can be realized.

A sixth embodiment of the present invention will hereinbelow be described in more detail with reference to the related drawings.

Figure 18:
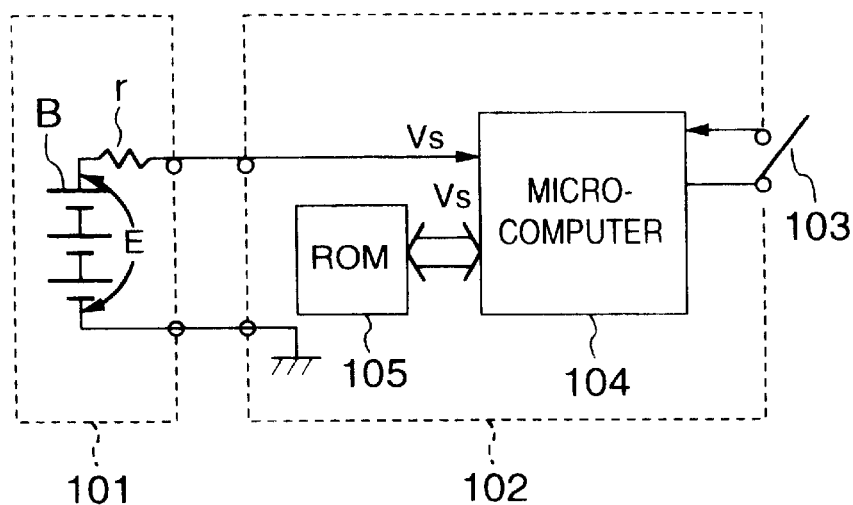
FIG. 18 is a block diagram, partly in circuit diagram, showing a configuration of a sixth embodiment of the present invention.

FIG. 18 is a block diagram, partly in circuit diagram, showing a configuration of the sixth embodiment in which the apparatus for detecting a remaining power of a battery according to the present invention is applied to a portable radio apparatus. In the figure, reference numeral 101 designates a secondary battery pack, reference numeral 102 designates a portable radio apparatus, reference numeral 103 designates a press-to-talk switch, reference numeral 104 designates a microcomputer, and reference numeral 105 designates a read only memory (ROM).

The secondary battery pack 101 self-contains a lithium ion series secondary battery B consisting of three unit cells for example. Therefore, the terminal voltage $V_B$ in the charge state and the open state is 12.6V. The lithium ion series secondary battery B is packed with the connection terminals provided so as to be able to attach and detach arbitrarily it to and from the portable radio apparatus 102.

Now, as well known, the battery is, as shown in the figure, represented equivalently by both an electromotive force E and an internal resistance r. This internal resistance r exhibits the minimum value when the battery is in the full charge state, and increases as the battery is discharged. It is also already described that increase in the internal resistance r is in particular remarkable in the lithium ion series battery.

The portable radio apparatus 102 is of the so-called press-to-talk mode and is designed in such a way that it is controlled by the microcomputer 104 and becomes the operatable state by turning a power source switch (not shown) on, and under this state, it is in the reception operation when the press-to-talk switch 103 is opened, while it is in the transmission operation only when that switch 103 is closed.

Normally, in the radio apparatus, as compared with the amount of power consumption in the reception waiting or in reception of a signal, the amount of power consumption in transmission is considerably large. For example, in the former, the battery current is 100 mA, while in the latter, the battery current is 600 mA. Thus, there is the considerable difference therebetween. Therefore, in this portable radio apparatus, the battery current when the press-to-talk switch 3 is closed is greatly different from the battery current when the press-to-talk switch 3 is opened. That is, the battery current is largely depending on the operation mode (i.e., ON state or OFF state) of the press-to-talk switch 3.

The ROM 105 serves to store therein the data relating to the discharge end detection voltage which is required for detecting the remaining power of the battery. Then, in the present embodiment, the data relating to two kinds of discharge and detection voltages, i.e., a voltage Vs1 (=8.1V) and a voltage Vs2(=7.5V) is stored in the ROM 105.

The microcomputer 104 is designed in such a way that it controls both the transmission portion and the reception portion of the portable radio apparatus 102, carries out the control required for the communication based on the press-to-talk mode, fetches in the voltage $V_B$ from the battery pack 10, compares the voltage $V_B$ with the discharge end detection voltage which is already set in the ROM 105, and when the voltage $V_B$ across the terminals of the battery is decreased down to the discharge end detection voltage, regards the remaining power of the battery as zero to stop the operation of the portable radio apparatus 102.

In addition, the microcomputer 104 fetches in the data relating to the ON/OFF state of the press-to-talk switch 103, and selects one of the two kinds of discharge end detection voltages, i.e., the voltage Vs1 (=8.1V) and the voltage Vs2 (=7.7V), the data of which is stored in the ROM 105, in accordance with the fetch-in result. Then, the microcomputer 104 uses the voltage Vs1 as the discharge end detection voltage Vs when the press-to-talk switch 103 is in the OFF state, while uses the voltage Vs2 as the discharge end detection voltage Vs when the press-to-talk switch 103 is in the ON state, thereby carrying out the detection of the remaining power of the battery.

Next, the operation of the present embodiment will hereinbelow be described in detail with reference to FIG. 19.

Figure 19:
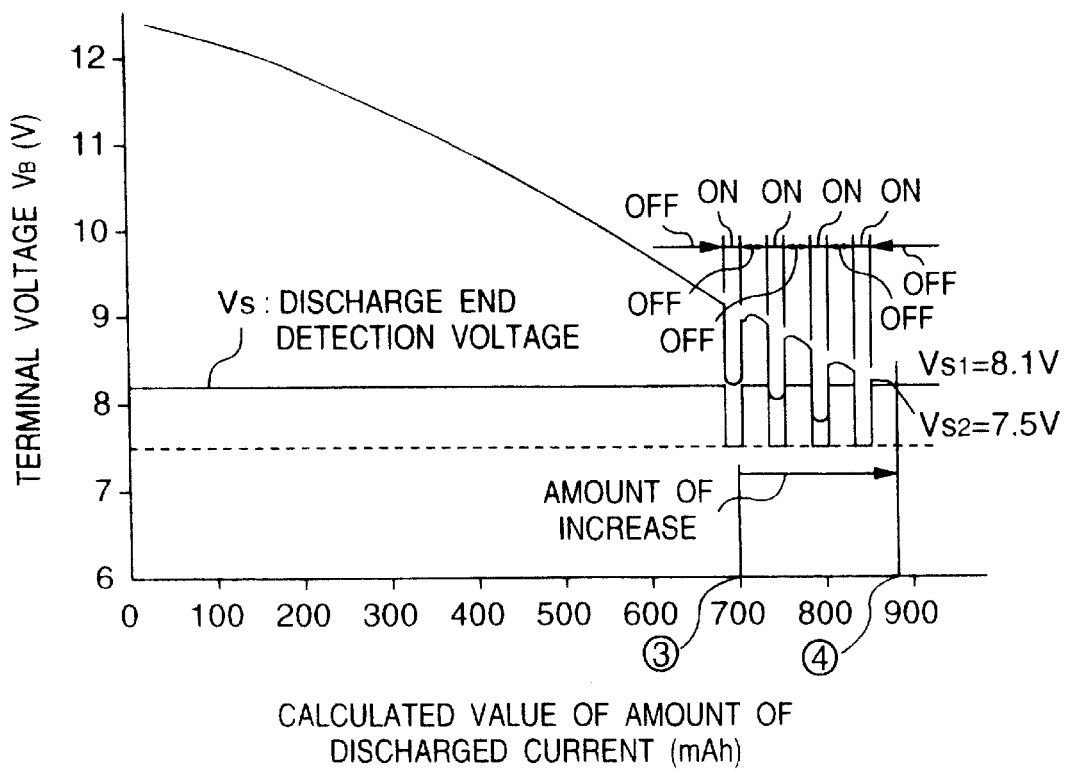
FIG. 19 is a characteristic view useful in explaining the operation of detecting a remaining power of a battery according to the present invention.

FIG. 19 shows the change in the terminal voltage $V_B$ when the lithium ion series secondary battery B having the recommendation rated capacity of about 900 mA is used, and after the portable radio apparatus 2 is set to the waiting mode until the capacity consumption becomes a little less than 700 mAh, the pattern of the transmission mode (ON) for about 1 min., the reception mode (OFF) for the same about 1 mn., and the subsequent waiting mode (OFF) for about 18 min. is repeated four times by operating the press-to-talk switch 3.

Figure 10:
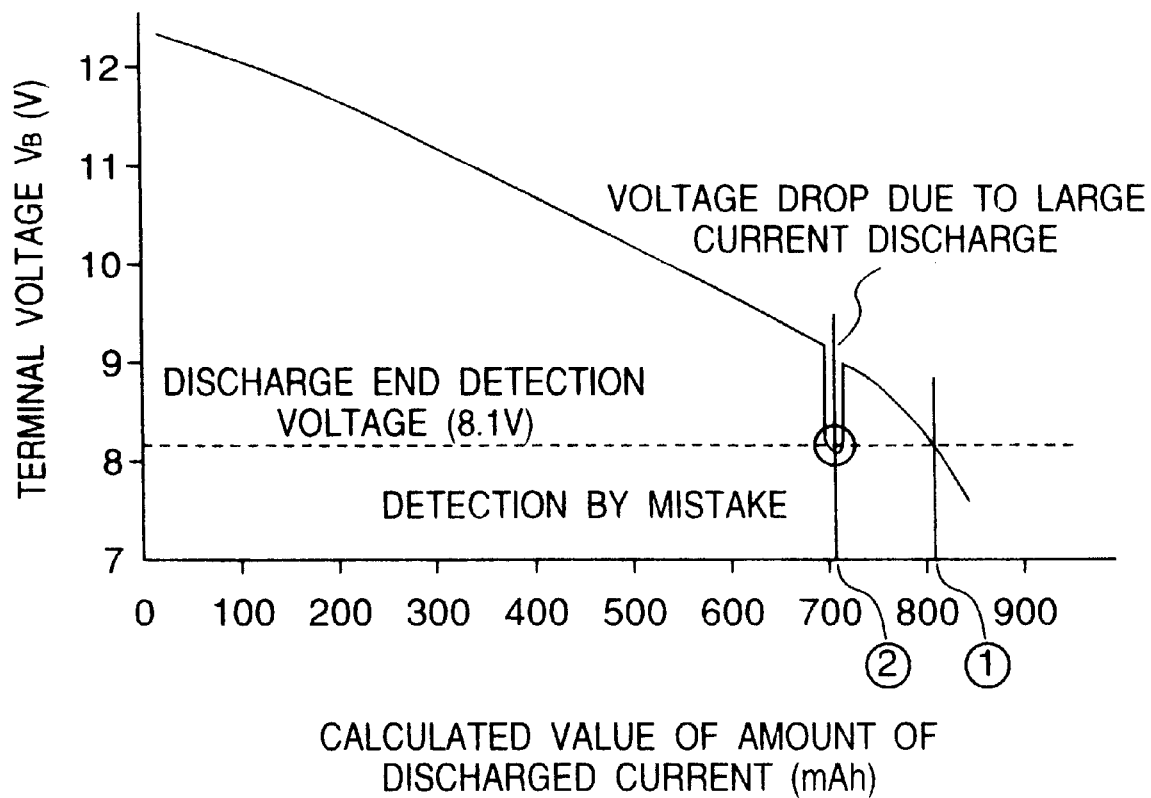
FIG. 10 is a characteristic view useful in explaining the conventional operation of detecting a remaining power of a battery.

Now, in FIG. 19, if similarly to the prior art described with reference to FIG. 10, the discharge end detection voltage is fixed to the voltage Vs1 (=Vs), as apparent from the figure, at a time point when the capacity consumption of the battery B reaches about 700 mAh represented by a point ③, the remaining power of the battery will be judged to be zero.

However, in the embodiment shown in FIG. 18, as apparent from FIG. 19, the discharge end detection voltage Vs is switched over to the voltage Vs1 when the press-to-talk switch 3 is in the OFF state, i.e., in the reception/waiting mode, or the voltage Vs2 when the press-to-talk switch 3 is in the ON state, i.e., in the transmission mode. Therefore, at a time point when the capacity consumption of the battery B reaches a little less than 900 mAh represented by a point ④, i.e., the capacity near the recommendation rated capacity of the battery B, the remaining power of the battery is judged to be zero.

Thus, the above-mentioned result will be collectively shown as follows.

TABLE 4

| press-to-talk switch 3 | operation mode | discharge end detection voltage | increase amount of operating time |
|---|---|---|---|
| OFF | reception/waiting | voltage Vs1 (=8.1 V) | 80 min.~ |
| ON | transmission | voltage Vs2 (=7.5 V) | 90 min. |

As apparent from Table 4, according to the embodiment of FIG. 18, in the general operating state of the portable radio apparatus 102, the portable radio apparatus 102 can be utilized up to approximately the full rated capacity of the battery B, and hence the operating time of the portable radio apparatus 102 can be prolonged by 90 min. at maximum.

Therefore, according to the above-mentioned embodiment, the remaining power of the battery can be sufficiently, effectively utilized, and hence the sufficient prolongation of the operating time by the battery can be obtained.

Now, in the embodiment of FIG. 18, the discharge end detection voltage Vs is switched over depending on the ON/OFF state of the press-to-talk switch 103. Alternatively, however, instead thereof, the procedure may be adopted in which the remaining power of the battery is detected only when the press-to-talk switch 103 is in the OFF state, and the operation of detecting the remaining power of the battery is prohibited when the press-to-talk switch 103 is in the ON state.

In this case, when after the press-to-talk switch 103 has been turned on, the terminal voltage of the battery is reduced, the operation of detecting the remaining power of the battery is not carried out at all. Therefore, since the mistaken detection of the remaining power of the battery due to the temporary reduction of the terminal voltage is not carried out at all, similarly to the embodiment of FIG. 18, the effective utilization of the power remaining in the battery becomes sufficiently possible, and hence the sufficient prolongation of the operating time by the battery can be obtained.

Now, while since the portable radio apparatus 102 is an object of application in the embodiment of FIG. 18, the change in the current of the battery B is detected on the basis of the ON/OFF state of the press-to-talk switch 103, the present invention is not limited thereto. That is, alternatively, the current may be detected by any means depending on the type of the load.

Incidentally, while the description has been given with respect to the specific case where the present invention is applied to the portable radio apparatus in the above-mentioned embodiments, it is to be understood that the present invention can also be applied to various electronic equipment in any case as long as it employs the battery as the power source.

According to the present invention, since the electronic equipment can always be accurately used up to the full capacity of the battery, the sufficient prolongation of the operatable time resulting from the effective utilization of the battery capacity can be obtained.

Figure 20:
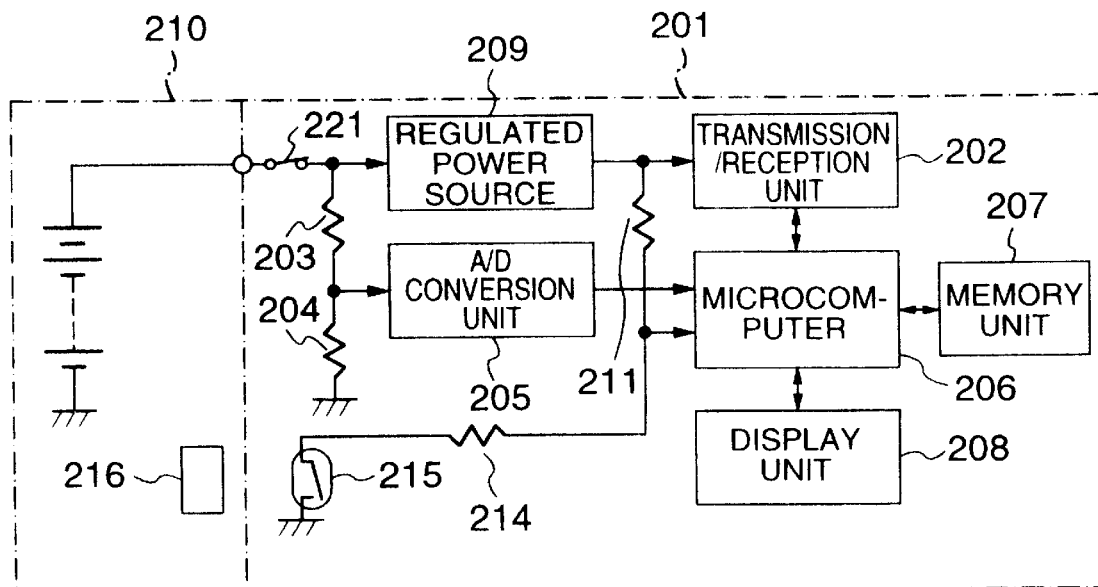
FIG. 20 is a block diagram, partly in circuit diagram, showing a configuration of a seventh embodiment of the present invention.

FIG. 20 is a block diagram, partly in circuit diagram, showing a configuration of a seventh embodiment of the present invention.

In FIG. 20, a microcomputer 206 compares the discharge characteristic data or the remaining power display voltage range of a battery 210 stored in a memory unit 207 with the power source voltage data which is obtained through the A/D conversion in an A/D conversion unit 205 in order to carry out the indication of the remaining power of the battery, the warning about the low power of the battery and the control for limitation of the operation.

In a radio apparatus 201 shown in FIG. 20, a port which is provided in the microcomputer 206 and through which the type and capacity of the battery are detected is pulled up to a level Hi through a resistor 211 and is grounded through both a resistor 214 and a reed switch 215. On the other hand, the battery 210 is provided with a magnet (means for generating a magnetic force) 216. Then, at the time when the battery 210 is integrated into the radio apparatus 210, the reed switch 215 in the radio apparatus 201 is closed by the magnetic force of the magnet 216 to provide the ON state.

The operation of the seventh embodiment will hereinbelow be described in detail.

At the time when the battery 210 having the magnet 216 mounted thereto is integrated into the radio apparatus 201, the reed switch 215 provided within the radio apparatus 201 is turned on, and the port used to detect the type and capacity of the battery which is provided in the microcomputer 206 has the voltage level which is obtained by dividing the power source voltage through both the resistors 211 and 214. Then, if the resistor 214 has the sufficiently low resistance value or is short-circuited, the port used to detect the type and capacity of the battery which is provided in the microcomputer 216 has a level Lo. In addition, at the time when the battery 210 having no magnet 216 mounted thereto is integrated into the radio apparatus 201, the reed switch 215 in the radio apparatus 201 is not closed but remains in the OFF state, and hence the port used to detect the type and capacity of a battery which is provided in the microcomputer 216 is pulled up to a level Hi through the resistor 211. When the battery 210 which is designed as described above is integrated into the radio apparatus 201, the microcomputer 206 can detect the two types of batteries on the basis of the voltage level at the port used to detect the type and capacity of a battery without through the terminals used to detect the type and capacity of a battery and coming mechanically in contact therewith. That is, in the case where the prepared batteries 210 are two types of batteries, i.e., the Ni-Cd series secondary battery and the Li ion series secondary battery, or the prepared batteries 210 are two types of batteries, i.e., the same Ni-Cd series secondary batteries having different capacities, it is possible to detect which battery a user integrates into the radio apparatus.

Figure 21:
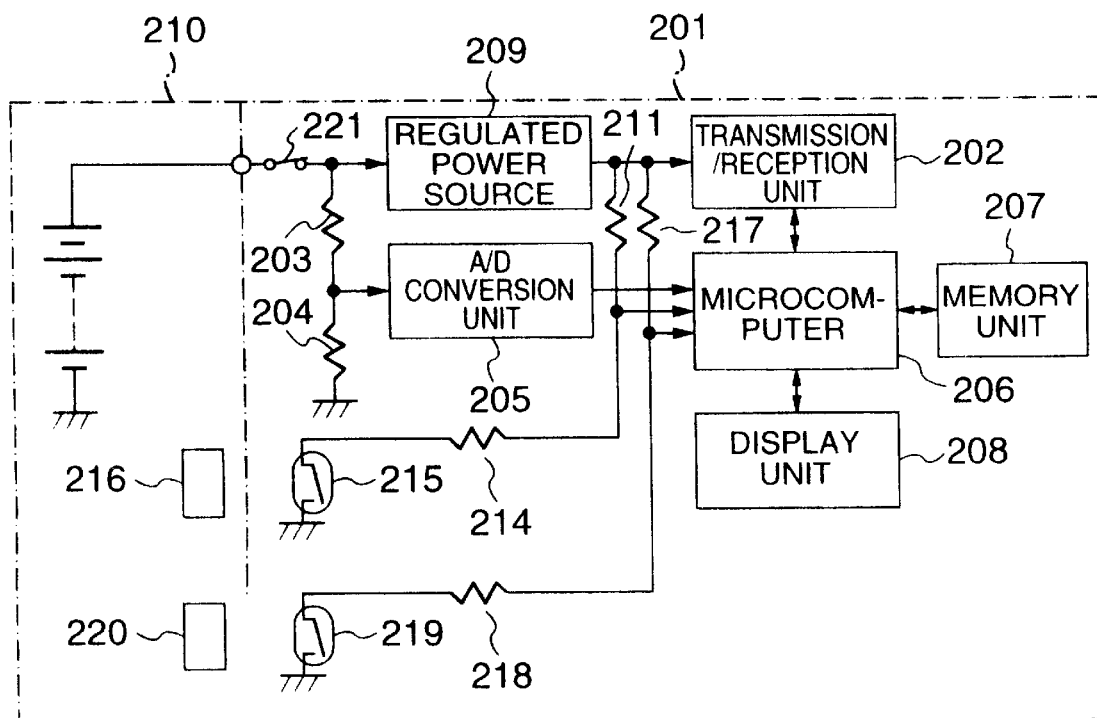
FIG. 21 is a block diagram, partly in circuit diagram, showing a configuration of a eighth embodiment of the present invention.

FIG. 21 is a block diagram, partly in circuit diagram, showing a configuration of a eighth embodiment of the present invention which is designed so as to be able to detect the more multiple types of batteries. In the present embodiment, the microcomputer 206 is provided with another port used to detect the type and capacity of a battery. Then, this another port is pulled up through a resistor 217 and also is grounded through both a resistor 218 and a reed switch 219. On the other hand, the battery 210 is provided with the magnets (means for generating a magnetic force) 216 and 220 for driving the reed switches 215 and 219 in the radio apparatus 201, respectively.

One port used to detect the type and capacity of a battery which is formerly provided is assigned a port ① and another port used to detect the type and capacity of a battery which is laterly provided is assigned a port ②. The voltage levels at the ports ① and ② are as shown in Table 5 in correspondence to the magnets provided in the battery 210. Thus, it is possible to detect four types of batteries.

TABLE 5

| type of battery | magnet 216 | magnet 220 | port ① | port ② |
| --- | --- | --- | --- | --- |
| A | absence | absence | level H | level H |
| B | absence | presence | level H | level L |
| C | presence | absence | level L | level H |
| D | presence | presence | level L | level L |

In FIG. 21, the memory 207 stores therein the multiple types of discharge characteristic data corresponding to the batteries which are to be integrated into the radio apparatus, and the indication of the remaining power of the battery, the warning about the low power of the battery and the control for limitation of the operation corresponding to the battery integrated thereinto are carried out on the basis of the multiple types of discharge characteristic data.

By constructing the battery and the electronic equipment in a manner as described above, it is possible to detect the batteries having different types and capacities without providing terminals coming mechanically in contact with the battery and the electronic equipment for detecting therethrough the batteries having the different types and capacities in both the electronic equipment side and the battery side. Therefore, since the means for ensuring the physical volume for mounting the terminals to the electronic equipment and the battery, and the stability for the connection of the terminals and the like becomes unnecessary, the structure is simplified and hence it is possible to improve the productivity.

Incidentally, while in the above-mentioned embodiment, the description has been given with respect to the specific example in which the magnet is provided in the battery side, it is to be understood that the present invention is not limited thereto, and hence means for generating a magnetic force such as a coil may also be available.

As set forth hereinabove, according to the present invention, since it is possible to detect batteries having different types and capacities without providing terminals coming mechanically in contact with a battery and electronic equipment for detecting therethrough batteries having different types and capacities in both the electronic equipment side and the battery side, the electronic equipment can be miniaturized and lightened, and also promotion of the low cost can be realized. In addition, since in the equipment requiring waterproof and the like, the realization of the equipment is improved due to its simple structure, in particular, the present invention can be effectively applied to portable electronic equipment.

We claim:

1. An electronic equipment comprising:
   a battery;
   a temperature sensor coupled with said battery, for measuring temperature of said battery;
   first detector for detecting the temperature of said battery on the basis of a signal from said temperature sensor;
   a memory unit for pre-storing a plurality of discharge characteristic data of said battery depending on temperature of said battery;
   output means for reading out one of said discharge characteristic data corresponding to said detected temperature of said battery from said memory unit;
   second detector for detecting a voltage level of said battery;
   calculating means for calculating data relating to a power consumption of said battery on the basis of both said detected voltage level of said battery and said read out discharge characteristic data;
   an indicator for indicating said calculated data relating to said power consumption of said battery; and
   control means for controlling said memory unit, said output means, said calculating means and said indicator.

2. An electronic equipment according to claim 1, further comprising:
   a transmission and reception unit coupled with said battery;
   an operating mode switcher coupled with said transmission and reception unit for switching a transmission mode, a reception mode and a waiting mode in said transmission and reception unit; and
   third detector for detecting said operation mode;
   wherein said data of said memory unit are a plurality of discharge characteristic data of said battery depending on temperature of said battery and said operating modes of said transmission and reception unit, and said output means reads out one of said discharge characteristic data corresponding to said detected temperature and said detected operating mode from said memory unit.

3. An electronic equipment according to clam 1,
   wherein said control means controls to indicate at least one of an indication for a remaining power of said battery and a warning indication for a low power of said battery.

4. An electronic equipment according to claim 1, further comprising:
   a power switch for stopping the electric power from said battery; and
   wherein said control means controls said power switch based on said detected voltage level of said battery.

5. An electronic equipment comprising:
   a battery;
   a temperature sensor coupled with said battery, for measuring temperature of said battery;
   an element indicating a type of said battery;
   first detector for detecting the temperature of said battery on the basis of a signal from said temperature sensor;
   second detector for detecting the type of said battery on the basis of said element;
   a memory unit for pre-storing a plurality of discharge characteristic data of batteries depending on temperature of said battery and a plurality types of batteries to be used;
   output means for reading out one of said discharge characteristic data corresponding to said detected temperature and said detected type of said battery from said memory unit;
   third detector for detecting a voltage level of said battery;
   calculating means for calculating data relating to a power consumption of said battery on the basis of both said detected voltage level of said battery and said read out discharge characteristic data;
   an indicator for indicating said calculated data relating to said power consumption of said battery; and
   control means for controlling said memory unit, said output means, said calculating means and said indicator.

6. An electronic equipment according to claim 5, further comprising:

a transmission and reception unit coupled with said battery;

an operating mode switcher coupled with said transmission and reception unit for switching a transmission mode, a reception mode and a waiting mode in said transmission and reception unit; and forth detector for detecting said operating mode;

wherein said data of said memory unit are a plurality of discharge characteristic data of said battery depending on temperature of said battery, a plurality types of batteries to be used and said operating modes of said transmission and reception unit, and said output means reads out one of said discharge characteristic data corresponding to said detected temperature, said detected type of battery and said detected operating mode from said memory unit.

7. An electronic equipment according to claim 5, wherein said control means controls to indicate at least one of an indication for a remaining power of said battery and a warning indication for a low power of said battery.

8. An electronic equipment according to claim 5, further comprising:

a power switch for stopping the electric power from said battery; and wherein said control means controls said power switch based on said detected voltage level of said battery.

9. An electronic equipment according to claim 5, wherein said temperature sensor and said element indicating the type of said battery are coupled to each other, and an output signal from said temperature sensor and said element is outputted from one terminal in common.

10. An electronic equipment according to claim 5, wherein said element indicating the type of said battery is means for generating a magnetic force, and said second detector is means for detecting said magnetic force to detect the type of said battery.

11. An electronic equipment comprising:

a battery;

a transmission and reception unit coupled with said battery;

an operating mode switcher coupled with said transmission and reception unit for switching a transmission mode, a reception mode and a waiting mode in said transmission and reception unit;

first detector for detecting said operating mode;

a memory unit for pre-storing a plurality of discharge characteristic data of said battery depending on said operation modes of said transmission and reception unit;

output means for reading out one of said discharge characteristic data corresponding to said detected operation mode from said memory unit;

second detector for detecting a voltage level of said battery;

calculating means for calculating data relating to a power consumption of said battery on the basis of both said detected voltage level of said battery and said selected discharge characteristic data;

an indicator for indicating said calculated data relating to said power consumption of said battery; and control means for controlling said memory unit, said output means, said calculating means and said indicator.

12. An electronic equipment according to claim 11, wherein said first detector detects said operation mode on the basis of detected signal levels of a press-to-talk switch signal and a squelch signal.

13. A method of enabling plural types of batteries to be selectively used, comprising the steps of:

storing previously discharge temperature characteristic data containing information corresponding to the change in the temperature and the change in the operation mode of electronic equipment in a memory unit every type of battery to be used;

integrating a battery including discrimination means for representing the type of said battery into said electronic equipment;

discriminating the type of said battery on the basis of said discrimination means included in said battery;

discriminating the temperature on the basis of a signal outputted from detection means for detecting temperature information;

discriminating an operation mode of said electronic equipment;

reading out the discharge temperature characteristic data corresponding to the type and temperature of said battery, and the operation mode of said electronic equipment which have been discriminated from a memory unit;

reading a voltage of said battery; and calculating the remaining power of said battery on the basis of both the battery voltage which has been read out and the discharge temperature characteristic data which has been read out to report the information relating to the remaining power thus calculated.

14. Electronic equipment including control means for comparing a voltage of a battery with a threshold of a discharge end detection voltage which is previously set and carrying out a predetermined control operation when the voltage of said battery is reduced to a level equal to or lower than the threshold of the discharge end detection voltage, comprising:

discrimination means for discriminating an operation mode of said electronic equipment; and means for changing the threshold of the discharge end detection voltage;

wherein the threshold of the discharge end detection voltage is changed in correspondence to the operation mode of said electronic equipment which has been discriminated.

15. Electronic equipment according to claim 14, wherein said control means carries out the control in such a way that when the voltage of said battery is reduced down to a level equal to or lower than the threshold of the discharge end detection voltage, the operation of said electronic equipment is stopped.

* * * * *